(12) United States Patent
Vargas

(10) Patent No.: US 8,206,842 B2
(45) Date of Patent: *Jun. 26, 2012

(54) ORGANIC ELEMENT FOR ELECTROLUMINESCENT DEVICES

(75) Inventor: J. Ramon Vargas, Webster, NY (US)

(73) Assignee: Global Oled Technology LLC, Wilmington, DE (US)

( * ) Notice: Subject to any disclaimer, the term of this patent is extended or adjusted under 35 U.S.C. 154(b) by 565 days.

This patent is subject to a terminal disclaimer.

(21) Appl. No.: 12/418,735

(22) Filed: Apr. 6, 2009

(65) Prior Publication Data

US 2010/0253210 A1    Oct. 7, 2010

(51) Int. Cl.
    *H01L 51/54* (2006.01)
(52) U.S. Cl. ......... 428/690; 428/917; 313/504; 313/506
(58) Field of Classification Search ............ None
    See application file for complete search history.

(56) References Cited

U.S. PATENT DOCUMENTS

| | | | |
|---|---|---|---|
| 3,172,862 | A | 3/1965 | Gurnee et al. |
| 3,173,050 | A | 3/1965 | Gurnee |
| 3,180,730 | A | 4/1965 | Klupfel et al. |
| 3,567,450 | A | 3/1971 | Brantly et al. |
| 3,658,520 | A | 4/1972 | Brantly et al. |
| 3,710,167 | A | 1/1973 | Dresner et al. |
| 4,356,429 | A | 10/1982 | Tang |
| 4,539,507 | A | 9/1985 | VanSlyke et al. |

(Continued)

FOREIGN PATENT DOCUMENTS

EP          0046861        7/1981

(Continued)

OTHER PUBLICATIONS

Dresner, Double Injection Electroluminescence Anthracene, RCA Review, vol. 30, pp. 322-334, 1969.

(Continued)

*Primary Examiner* — Dawn L. Garrett
(74) *Attorney, Agent, or Firm* — McKenna Long & Aldridge LLP

(57) ABSTRACT

An electroluminescent device including a cathode, an anode, and having therebetween a light-emitting layer including a boron complex represented by Formula (I), Formula (I)

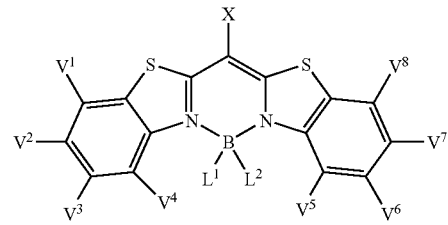

wherein:
  X represents hydrogen or a substituent;
  $V^1$ through $V^8$ represent hydrogen or an independently selected substituent, provided that adjacent substituents cannot join together to form an aromatic ring group and provided at least one of $V^2$ and $V^3$ represents a substituent;
  $L^1$ and $L^2$ represent independently selected substituents; and an anthracene compound containing an anthracene nucleus substituted in the 9- and 10-positions with independently selected aryl groups containing from 6 to 24 carbon atoms, and wherein the anthracene nucleus can be further substituted provided the anthracene nucleus does not contain an aromatic substituent in positions 1-8.

19 Claims, 1 Drawing Sheet

U.S. PATENT DOCUMENTS

| | | |
|---|---|---|
| 4,720,432 A | 1/1988 | VanSlyke et al. |
| 4,769,292 A | 9/1988 | Tang et al. |
| 4,774,339 A | 9/1988 | Haugland et al. |
| 4,885,211 A | 12/1989 | Tang et al. |
| 4,885,221 A | 12/1989 | Tsuneeda et al. |
| 5,059,861 A | 10/1991 | Littman et al. |
| 5,059,862 A | 10/1991 | VanSlyke et al. |
| 5,061,569 A | 10/1991 | VanSlyke et al. |
| 5,121,029 A | 6/1992 | Hosokawa et al. |
| 5,141,671 A | 8/1992 | Bryan et al. |
| 5,150,006 A | 9/1992 | Van Slyke et al. |
| 5,151,629 A | 9/1992 | Van Slyke et al. |
| 5,247,190 A | 9/1993 | Friend et al. |
| 5,276,380 A | 1/1994 | Tang |
| 5,294,870 A | 3/1994 | Tang et al. |
| 5,405,709 A | 4/1995 | Littman et al. |
| 5,409,783 A | 4/1995 | Tang et al. |
| 5,484,922 A | 1/1996 | Moore et al. |
| 5,552,678 A | 9/1996 | Tang et al. |
| 5,554,450 A | 9/1996 | Shi et al. |
| 5,593,788 A | 1/1997 | Shi et al. |
| 5,608,287 A | 3/1997 | Hung et al. |
| 5,645,948 A | 7/1997 | Shi et al. |
| 5,677,572 A | 10/1997 | Hung et al. |
| 5,683,823 A | 11/1997 | Shi et al. |
| 5,688,551 A | 11/1997 | Littman et al. |
| 5,703,436 A | 12/1997 | Forrest et al. |
| 5,714,838 A | 2/1998 | Haight et al. |
| 5,739,545 A | 4/1998 | Guha et al. |
| 5,755,999 A | 5/1998 | Shi et al. |
| 5,766,779 A | 6/1998 | Shi et al. |
| 5,776,622 A | 7/1998 | Hung et al. |
| 5,776,623 A | 7/1998 | Hung et al. |
| 5,837,391 A | 11/1998 | Utsugi |
| 5,851,709 A | 12/1998 | Grande et al. |
| 5,852,191 A | 12/1998 | Karandikar et al. |
| 5,908,581 A | 6/1999 | Chen et al. |
| 5,927,247 A | 7/1999 | Tanaka |
| 5,928,802 A | 7/1999 | Shi et al. |
| 5,935,720 A | 8/1999 | Chen et al. |
| 5,935,721 A | 8/1999 | Shi et al. |
| 5,969,474 A | 10/1999 | Arai |
| 5,981,306 A | 11/1999 | Burrows et al. |
| 6,020,078 A | 2/2000 | Chen et al. |
| 6,066,357 A | 5/2000 | Tang et al. |
| 6,137,223 A | 10/2000 | Hung et al. |
| 6,140,763 A | 10/2000 | Hung et al. |
| 6,172,459 B1 | 1/2001 | Hung et al. |
| 6,207,464 B1 | 3/2001 | Karandikar et al. |
| 6,208,075 B1 | 3/2001 | Hung et al. |
| 6,208,077 B1 | 3/2001 | Hung |
| 6,226,890 B1 | 5/2001 | Boroson et al. |
| 6,237,529 B1 | 5/2001 | Spahn et al. |
| 6,278,236 B1 | 8/2001 | Madathil et al. |
| 6,284,393 B1 | 9/2001 | Hosokawa et al. |
| 6,337,492 B1 | 1/2002 | Jones et al. |
| 6,396,209 B1 | 5/2002 | Kido et al. |
| 6,423,429 B2 | 7/2002 | Kido et al. |
| 6,661,023 B2 | 12/2003 | Hoag et al. |
| 6,689,493 B2 | 2/2004 | Motomatsu et al. |
| 6,689,494 B1 | 2/2004 | Karandikar |
| 6,720,092 B2 | 4/2004 | Hatwar |
| 6,720,573 B2 | 4/2004 | Son et al. |
| 6,773,832 B2 | 8/2004 | Sotoyama et al. |
| 6,824,895 B1 | 11/2004 | Sowinski et al. |
| 6,936,961 B2 | 8/2005 | Liao et al. |
| 7,074,503 B2 * | 7/2006 | Helber et al. ............... 428/690 |
| 7,074,603 B2 | 7/2006 | Verser et al. |
| 7,126,271 B2 | 10/2006 | Lee et al. |
| 7,147,938 B2 * | 12/2006 | Helber et al. ............... 428/690 |
| 7,165,340 B2 | 1/2007 | Long et al. |
| 7,232,588 B2 | 6/2007 | Long et al. |
| 7,238,389 B2 | 7/2007 | Long et al. |
| 7,288,285 B2 | 10/2007 | Long et al. |
| 7,288,286 B2 | 10/2007 | Long et al. |
| 7,300,709 B2 | 11/2007 | Owczarczyk et al. |
| 7,329,466 B2 | 2/2008 | Vargas et al. |
| 2003/0068528 A1 | 4/2003 | Thompson et al. |
| 2003/0198829 A1 | 10/2003 | Hoag et al. |
| 2004/0113547 A1 | 6/2004 | Son et al. |
| 2004/0255857 A1 | 12/2004 | Chow et al. |
| 2005/0170205 A1 * | 8/2005 | Helber et al. ............... 428/690 |
| 2006/0003183 A1 * | 1/2006 | Helber et al. ............... 428/690 |
| 2006/0134460 A1 | 6/2006 | Kondakova et al. |
| 2006/0269782 A1 * | 11/2006 | Liao et al. .................. 428/690 |
| 2007/0020483 A1 * | 1/2007 | Park et al. .................. 428/690 |
| 2007/0092753 A1 * | 4/2007 | Begley et al. ............... 428/690 |
| 2008/0032123 A1 * | 2/2008 | Spindler et al. ............ 428/336 |

FOREIGN PATENT DOCUMENTS

| | | |
|---|---|---|
| EP | 681019 | 11/1995 |
| EP | 0 732 868 | 9/1996 |
| EP | 0 891 121 | 1/1999 |
| EP | 1 029 909 | 8/2000 |
| EP | 1 076 368 | 2/2001 |
| EP | 0747448 | 11/2002 |
| JP | 8-333569 | 12/1996 |
| JP | 09-13026 | 1/1997 |
| JP | 09-289081 | 4/1997 |
| JP | 11-097180 | 9/1999 |
| JP | 2001-294-851 | 10/2001 |
| WO | WO 98/55561 | 12/1998 |
| WO | WO 00/18851 | 4/2000 |
| WO | WO 00/57676 | 9/2000 |
| WO | WO 00/70655 | 11/2000 |
| WO | WO 01/41512 | 6/2001 |
| WO | WO 01/93642 | 12/2001 |

OTHER PUBLICATIONS

Tang et al, Electroluminescene of doped organic thin films, J. Applied Physics 65, pp. 3610-3616, 1989.

Nonoyama, "Benzo[h]quinolin-10-yl-N Iridium (III) Complexes", Bulletin of the Chemical Society of Japan, vol. 47(3), pp. 767-768, 1974.

Johnson et al., "Luminescent Iridium(I), Rhodium(I), and Platinum(II) Dithiolate Complexes", Journal of American Chemical Society, vol. 105, pp. 1795-1802, 1983.

Wrighton et al., The Nature of the Lowest Excited State in Tricarbonylchloro-1,10-phenanthrolinerhenium(I) and Related Complexes, Journal of the American Chemical Society, vol. 96, No. 4, pp. 998-1003, 1974.

Yam, "Luminescent carbon-rich rhenium(I) complexes", Chem. Commun. pp. 789-796, 2001.

Ma et al., "Electroluminescence from triplet metal-ligand charge-transfer excited state of transition metal complexes", Synthetic Metals 94, pp. 245-248, 1998.

Kido et al., "Electroluminescence in a Terbium Complex", Chem. Lett. pp. 657-660, 1990.

Kido et al., "Organic electroluminescent devices using lanthanide complexes", J. Alloys and Compounds 192, pp. 30-33, 1993.

Kido et al., White-Light-Emitting Organic Electroluminescent Device Using Lanthanide Complexes, Jpn. J. Appl. Phys., vol. 35, pp. L394-L396, 1996.

Kido et al., "Bright red light-emitting organic electroluminescent devices having a europium complex as an emitter", Appl. Phys. Lett., 65 (17), pp. 2124-2126, 1994.

Chen et al., "Recent Developments in Molecular Organic Electroluminescent Materials", Macromol. Symp. 125, pp. 1-48, 1997.

Hung et al., "Recent progress of molecular organic electroluminescent materials and devices", Materials Science and Engineering R39, pp. 143-222, 2002.

* cited by examiner

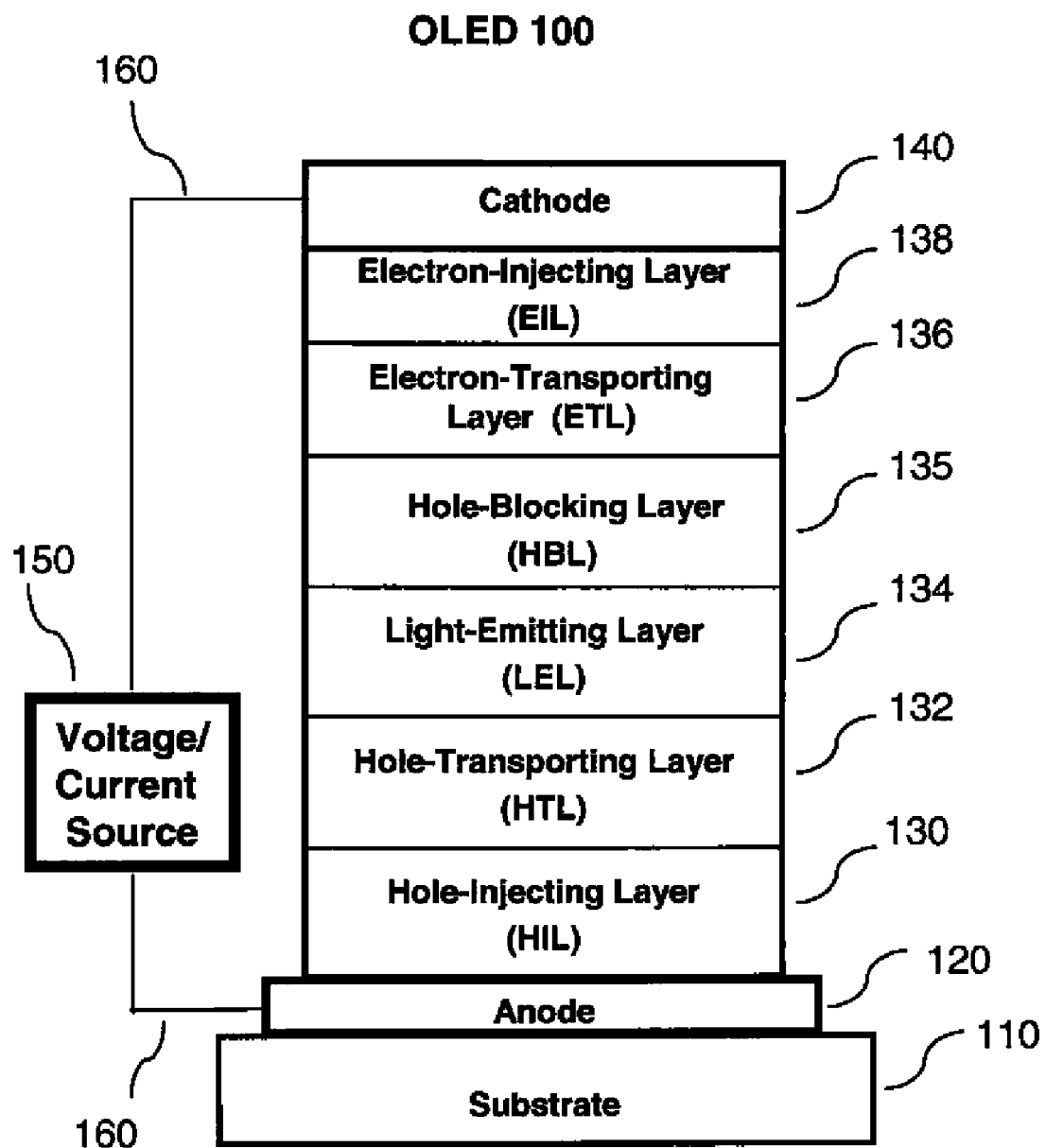

ORGANIC ELEMENT FOR ELECTROLUMINESCENT DEVICES

FIELD OF THE INVENTION

This invention relates to an electroluminescent (EL) device, including a light-emitting layer containing a specific type of boron complex and a specific type of anthracene compound, which can provide a range of hues including a short-blue color.

BACKGROUND OF THE INVENTION

While organic electroluminescent (EL) devices have been known for over two decades, their performance limitations have represented a barrier to many desirable applications. In simplest form, an organic EL device includes an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322-334, 1969; and Dresner U.S. Pat. No. 3,710,167, issued Jan. 9, 1973. The organic layers in these devices, usually composed of a polycyclic aromatic hydrocarbon, were very thick (much greater than 1 μm). Consequently, operating voltages were very high, often >100V.

More recent organic EL devices include an organic EL element consisting of extremely thin layers (e.g. <1.0 μm) between the anode and the cathode. Herein, the term "organic EL element" encompasses the layers between the anode and cathode. Reducing the thickness lowered the resistance of the organic layer and has enabled devices that operate at much lower voltage. In a basic two-layer EL device structure, described first in U.S. Pat. No. 4,356,429, one organic layer of the EL element adjacent to the anode is specifically chosen to transport holes, and therefore, it is referred to as the hole-transporting layer, and the other organic layer is specifically chosen to transport electrons, and is referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al (*J. Applied Physics*, 65, Pages 3610-3616, (1989)). The light-emitting layer commonly includes a host material doped with a guest material, also known as a dopant. Still further, there has been proposed in U.S. Pat. No. 4,769,292 a four-layer EL element including a hole-injecting layer (HIL), a hole-transporting layer (HTL), a light-emitting layer (LEL) and an electron transport/injection layer (ETL). These structures have resulted in improved device efficiency Since these early inventions, further improvements in device materials have resulted in improved performance in attributes such as color, stability, luminance efficiency and manufacturability, e.g., as disclosed in U.S. Pat. Nos. 5,061,569, 5,409,783, 5,554,450, 5,593,788, 5,683,823, 5,908,581, 5,928,802, 6,020,078, and 6,208,077, amongst others.

Notwithstanding these developments, there are continuing needs for organic EL device components, such as light-emitting materials, sometimes referred to as dopants, that will provide high luminance efficiencies combined with high color purity and long lifetimes. In particular, there is a need to be able to adjust the emission wavelength of the light-emitting material for various applications. For example, in addition to the need for blue, green, and red light-emitting materials there is a need for blue-green, yellow and orange light-emitting materials in order to formulate white-light emitting electroluminescent devices. For example, a device can emit white light by emitting a combination of colors, such as blue-green light and red light or a combination of blue light and orange light.

White EL devices can be used with color filters in full-color display devices. They can also be used with color filters in other multicolor or functional-color display devices. White EL devices for use in such display devices are easy to manufacture, and they produce reliable white light in each pixel of the displays. Although the OLEDs are referred to as white and can appear white or off-white, for this application, the CIE coordinates of the light emitted by the OLED are less important than the requirement that the spectral components passed by each of the color filters be present with sufficient intensity in that light. The devices must also have good stability in long-term operation. That is, as the devices are operated for extended periods of time, the luminance of the devices should decrease as little as possible.

Ridgidized boron complexes have been used as labeling dyes in analytical and biological applications; for example, see U.S. Pat. No. 4,774,339, EP 747,448 and EP 46,861. However, boron complexes have found only limited application as dopants in electroluminescent devices. In one example, a useful class of dopants is derived from the 5,6,5-tricyclic pyrromethene-BF2 complexes and disclosed in U.S. Pat. No. 5,683,823; JP 09 289,081A; and JP 11097,180A. These materials are characterized by typically narrow emission spectra, which can result in attractively high color purity. However, the green emitting unsubstituted or allyl substituted pyrromethene-$BF_2$ complexes exhibit relatively low quantum efficiencies of electroluminescence. In order to achieve highly efficient OLEDs, one needs to use phenyl rings as substituents thereby extending the conjugated π-system. As a result the emission wavelength typically becomes red-shifted yielding a reddish amber color, which is the shortest wavelength light that can be emitted by pyrromethene-BF2 complexes with good efficiency. In simple terms, luminance efficient green or blue-green OLEDs do not appear to be conveniently obtained with pyrromethene $BF_2$ complexes used as dopants.

JP 2001294851A describes boron complexes of heterocycles used in an electroluminescent device. For example, materials in which one ring includes a cyclic amide or sulfonamide. However, these materials are reported to afford a narrow emission spectrum, which would not necessarily be desirable for use in a white-light-emitting device, which must emit a broad spectrum of light.

U.S. Pat. No. 6,661,023 describes electroluminescent (EL) device containing a boron dopant compound containing a bis(azinyl)methene boron complex. Such compounds, however, can be inefficient in their quantum efficiency of emission. The use of these materials is also limited by the difficulty in tuning the emission wavelengths, for example, to obtain a blue-green emission. Certain boron complex containing devices are also described in U.S. Patent Application Publication No. 2003-0198829 A1 to Benjamin P. Hoag et al.

U.S. Pat. Nos. 5,852,191 and 6,207,464 disclose various fluorescent boron complexes and wherein the boron is bonded to a nitrogen atom of a 5-membered heteroaromatic ring group and to a nitrogen atom of a second 5-membered heteroaromatic ring group, and wherein the 5-membered rings are further connected by a methene bridge to form a six-membered ring. U.S. Pat. Nos. 6,689,494, 7,074,503, and 7,147,938 describe OLED devices containing similar boron complexes. However, certain compounds of this type can have low quantum efficiencies and it can be difficult to obtain some desirable emission colors such as a short-blue color.

There are a large number of light-emitting materials that are useful in OLED devices and that permit the fabrication of devices that emit light having a blue color, that is, light which has a wavelength between 400 and 500 nm. However, many of these materials provide a medium-blue color having a maximum emission in the range of 535-560 nm. In order to obtain devices with increased color gamut it is desirable to develop materials that have a maximum emission in the short-blue region, particularly in the wavelength region of 425-435 nm. Materials which exhibit short-blue emission are also useful in combination with other light-emitting materials, for example, they can be used with green and red emitting materials to form a white emission. A short-blue emission provides better blue-green color separation relative to a medium blue emission, which can result in improved color reproduction. Thus, it is a problem to be solved to provide a light-emitting material for an EL device that exhibits good luminance efficiency particularly in the short-blue color region.

SUMMARY OF THE INVENTION

The invention provides an electroluminescent device having an anode, a cathode and therebetween a light-emitting layer containing:

(a) a boron complex represented by Formula (I),

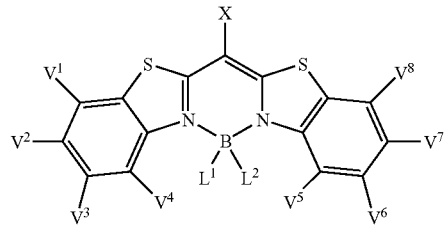

Formula (I)

wherein:
X represents hydrogen or a substituent; $V^1$ through $V^8$ represent hydrogen or an independently selected substituent, provided that adjacent substituents cannot join together to form an aromatic ring group and provided at least one of $V^2$ and $V^3$ represents a substituent; and $L^1$ and $L^2$ represent independently selected substituents; and (b) an anthracene compound containing an anthracene nucleus substituted in the 9- and 10-positions with independently selected aryl groups containing from 6 to 24 carbon atoms, and wherein the anthracene nucleus can be further substituted provided the anthracene nucleus does not contain an aromatic substituent in positions 1-8.

Desirably, the electroluminescent device also includes an electron-transporting layer containing a polycyclic aromatic hydrocarbon such as an anthracene or fluoranthene derivative. In addition, the electron-transporting layer preferably also contains an alkali metal or alkali metal compound.

Embodiments of the invention provide a light-emitting material for an EL device that exhibits good luminance efficiency particularly in the short-blue color region.

BRIEF DESCRIPTION OF THE DRAWINGS

FIG. 1 shows a schematic cross-sectional view of one embodiment of the OLED device of the present invention. It will be understood that FIG. 1 is not to scale since the individual layers are too thin and the thickness differences of various layers are too great to permit depiction to scale.

DETAILED DESCRIPTION OF THE INVENTION

The invention is generally as described above. An electroluminescent device of the invention can be a multilayer device including a cathode, an anode, charge-injecting layers (if necessary), charge-transporting layers, and a light-emitting layer (LEL). The light emitting layer includes a boron complex according to Formula (I).

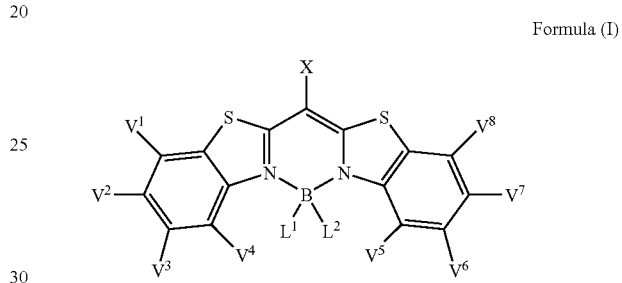

Formula (I)

In Formula (I), X represents hydrogen or a substituent such as, for example, cyano, trifluoromethyl, an aryl group containing from 6 to 24 carbon atoms such as a phenyl group or a tolyl group, a heteroaryl group such as a pyridyl group, or an alkyl group containing from 1 to 24 carbon atoms such as a methyl group or t-butyl group.

$L^1$ and $L^2$ represent independently selected substituents. Illustrative examples of suitable substituents include a halogen substituent, an alkyl group, an aryl group, an alkoxy group, an alkylthio group, an arylthio group, a sulfamoyl group, an acetamido group, a diarylamino group, and an aryloxy group. In one desirable embodiment $L^1$ and $L^2$ represent independently a fluoro substituent or an alkyl carboxylate group, such as an acetate group or propionate group. Desirably $L^1$ and $L^2$ both represent a fluoro substituent.

$V^1$ through $V^8$ represent hydrogen or an independently selected substituent, provided that adjacent substituents cannot join together to form an aromatic ring group and provided at least one of $V^2$ and $V^3$ represents a substituent. Examples of useful substituents include aryl groups containing from 6 to 24 carbon atoms such as a phenyl group or a naphthyl group, alkyl groups containing from 1 to 24 carbon atoms such as a methyl or t-butyl group, and cyano and fluoro substituents. In one desirable embodiment, at least one of $V^2$, $V^3$, $V^6$, and $V^7$ represents an aryl group containing from 6 to 24 carbon atoms. In another suitable embodiment, at least one of $V^2$ and $V^3$, and at least one of $V^6$ and $V^7$ represent an independently selected aryl group containing from 6 to 24 carbon atoms. Although adjacent $V^1$ through $V^8$ groups cannot join together to form an aromatic ring group such as a fused benzene group, they can combine to form a nonaromatic ring group, for example, a cyclohexane group.

In another suitable embodiment, the boron complex is represented by Formula (II).

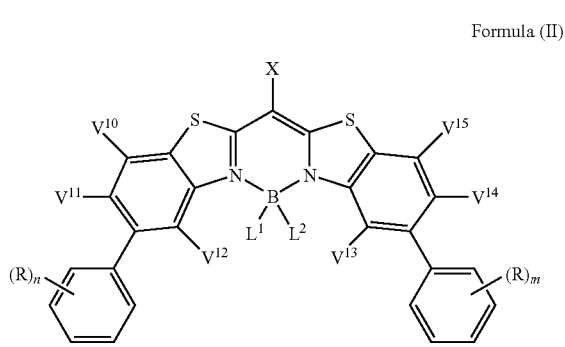

Formula (II)

In Formula (II), X has been described previously. In one embodiment, X represents hydrogen or an alkyl group containing from 1 to 24 carbon atoms. $V^{10}$ through $V^{15}$ represent hydrogen, or a substituent such as an aryl group containing 6-24 carbon atoms, for example, a tolyl group, or, for example, an alkyl group containing from 1 to 24 carbon atoms such as a t-butyl group, and provided adjacent substituents cannot join to form an aromatic ring group. In a further embodiment, $V^{10}$ through $V^{15}$ represent hydrogen.

Each R can be the same or different and represents an independently selected substituent, for example, an alkyl group containing from 1 to 24 carbon atoms such as a methyl group or, for example, an aryl group having 6 to 24 carbon atoms such as a tolyl group. Adjacent R groups can join to form a ring group such as a five- or six-membered ring group, for example, a benzene ring group.

The light-emitting layer also includes an anthracene compound having an anthracene nucleus substituted in the 9- and 10-positions with aromatic groups such as, for example, aryl groups containing from 6 to 24 carbon atoms, e.g., naphthyl groups or biphenyl groups. The numbering system for the anthracene nucleus is shown below.

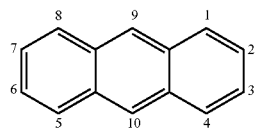

The anthracene is not further substituted with aromatic groups, that is, there are no aromatic groups present in the 1-8 positions of the anthracene nucleus. Aromatic groups in one of these positions, for example, the 2-position can have undesirable effects on the color of light emitted by the light-emitting layer. However, the anthracene compound can be flintier substituted with independently selected non-aromatic groups in positions 1-8, for example, alkyl groups containing from 1 to 24 carbon atoms such as t-butyl, methyl, or s-pentyl.

In one desirable embodiment, the anthracene compound is represented by Formula (III).

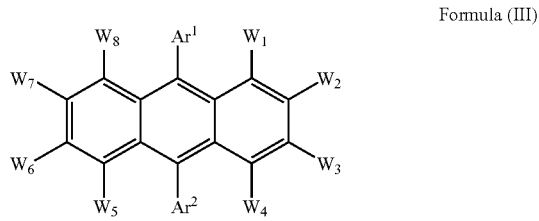

Formula (III)

In Formula (III), $Ar^1$ and $Ar^2$ are independently chosen aryl groups containing from 6 to 24 carbon atoms; especially desirable are phenyl groups, naphthyl groups such as, for example, a 2-naphthyl or 1-naphthyl group, and biphenyl groups such as, for example, 4-biphenyl or 3-biphenyl groups.

$W_1$ through $W_8$ represent hydrogen or an independently selected alkyl group containing from 1 to 24 carbon atoms such as, for example, a methyl group or a t-butyl group. In one embodiment, $W_1$ through $W_8$ represent hydrogen.

Preferably, the substituents of the anthracene compound are chosen so that the anthracene compound absorbs light at a shorter wavelength than the boron complex and the emission spectrum of the anthracene compound overlaps with the absorption spectrum of the boron complex.

Desirably, at least one boron complex is present in an amount of up to 10 wt. % of the light-emitting layer, more typically from 0.1-10.0 wt. %, and frequently 0.25-8.0 wt. % of the layer. Suitably, at least one anthracene compound is present in an amount up to 99.9 wt.% of the layer, more typically from 90 to 99 wt. % of the layer. In one suitable embodiment, the boron complex is present in an amount of up to 10 wt. % of the anthracene compound. The light-emitting layer typically has a thickness of 1-200 nm, suitably 2-100 nm, often 5-50 nm, and commonly 10-40 nm.

Embodiments of the invention provide not only improved luminance efficiency but also a range of hues as evidenced by the location and shape of the emission curve of the emitted light. In some embodiments, the combination of the boron complex and the anthracene host can provide a desirable short-blue emission. Color is often defined in terms of CIE (Commission Internationale de L'Eclairage) coordinates as is well known in the art. By short-blue emission is meant that the $CIE_x$ coordinate of the light emitted is between 0.08 and 0.20, and desirably between 0.10 and 0.15; and the $CIE_y$ coordinate is 0.11 or less, and desirably 0.10 or less, but greater than 0.0.

In another embodiment, the substituents on the boron complex, e.g., a complex represented by Formula (I) having substituents X, $V^1$ through $V^8$, $L^1$ and $L^2$, are chosen such that when the complex is incorporated into the light-emitting layer of an EL device, the light-emitting layer emits light having a $CIE_x$ coordinate that is between 0.08 and 0.20, suitably between 0.10 and 0.20, and desirably between 0.10 and 0.15; and having a $CIE_y$ coordinate that is 0.11 or less, desirably 0.10 or less, but greater than 0.0.

In a further embodiment, desirable substituents for a complex of Formulae (I) and (II) are those that provide a boron complex that, at a concentration of less than $10^{-3}$ molar, has a maximum solution fluorescence wavelength between 425 nm and 435 nm; and a quantum yield of fluorescence of 0.70 or greater, and desirably 0.80 or greater. A suitable solvent is a solvent in which the complex is soluble. Preferred solvents do not substantially absorb or emit light in the region of 500 to 600 nm. Examples of useful solvents include ethyl acetate, dichloromethane, and methanol. Procedures for determining maximum solution fluorescence wavelength and quantum yield are well known to those skilled in the art (see, for example, C. A. Parker and W. T. Rees, Analyst, 85, 587 (1960)). For example, in one embodiment, suitable substituents of the boron complex represented by Formula (I), having substituents X, $V^1$ through $V^8$, $L^1$ and $L^2$, are chosen such that the complex, when dissolve in ethyl acetate at a concentration of less then $10^{-3}$ molar, has a maximum fluorescence emission between a wavelength of 425 nm and 435 nm and a quantum yield of 0.70 or greater. Desirably, the emission wavelength is between 430 nm and 435 nm.

Useful boron complexes can be synthesized by methods known in the literature. Desirably a suitable ligand is prepared and the ligand is then complexed to boron. For examples of boron complexation reactions see G, Sathyamoorthi, M. Soong, T. Ross, J. Boyer, *Heteroatom Chem.*, 4, 603 (1993) and 3. Douglass, P. Barelski, R. Blankenship, *J. Heterocycl Chem.*, 10, 255 (1973).

Illustrative examples of boron complexes useful in the present invention include the following compounds.
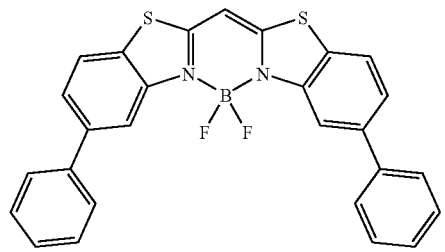
Inv-1
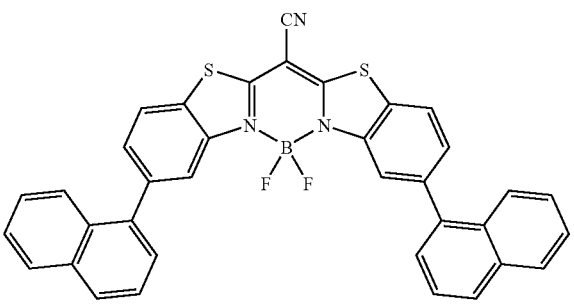
Inv-6
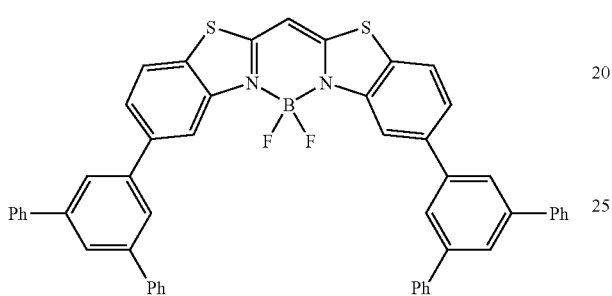
Inv-2
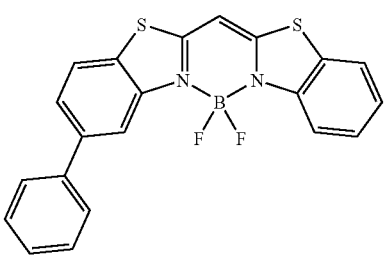
Inv-7
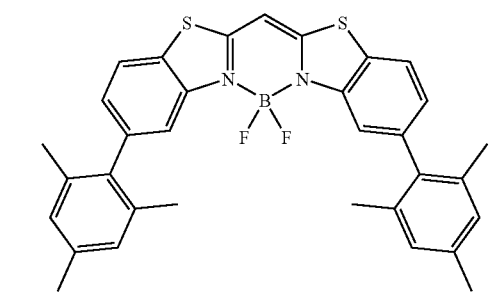
Inv-3
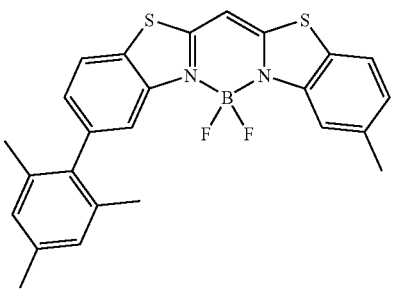
Inv-8
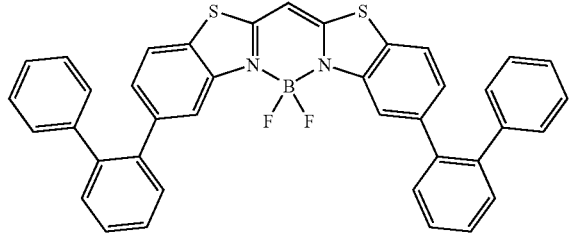
Inv-4
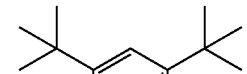
Inv-9
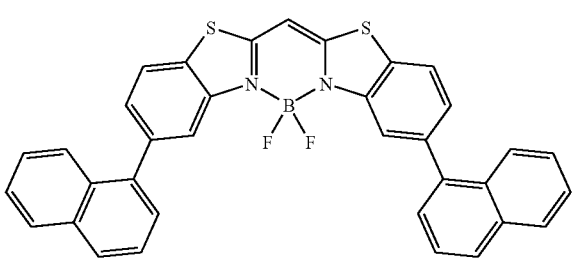
Inv-5
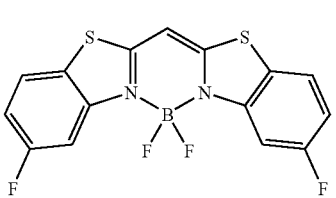
Inv-10

Inv-11
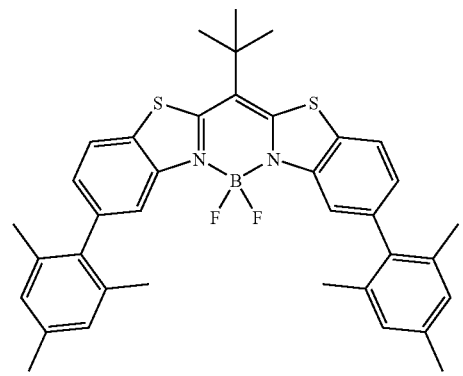
Inv-12
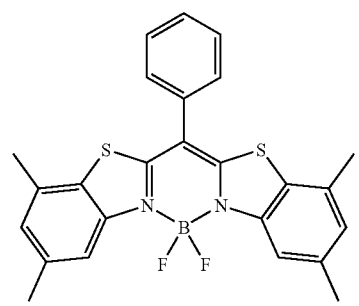
Inv-13
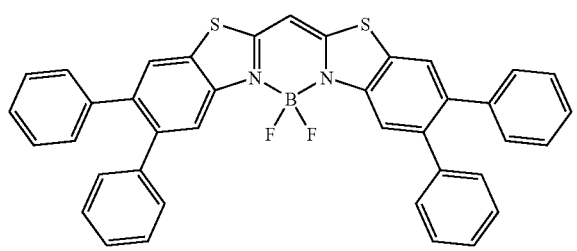
Inv-14
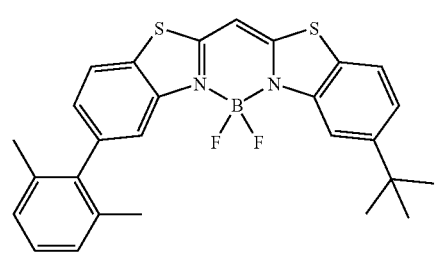
Inv-15
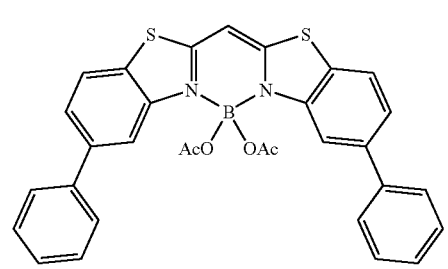
Inv-16
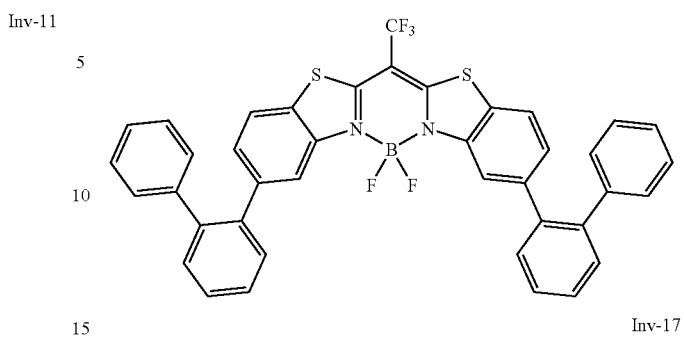
Inv-17
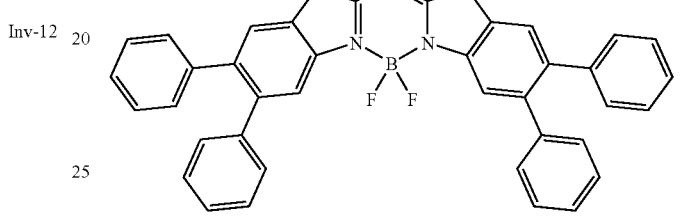
Inv-18
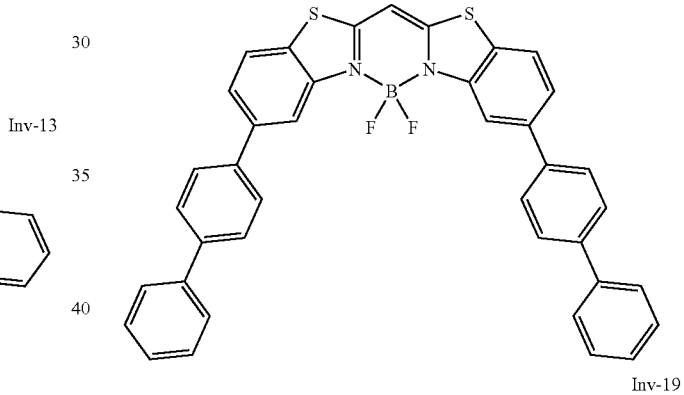
Inv-19
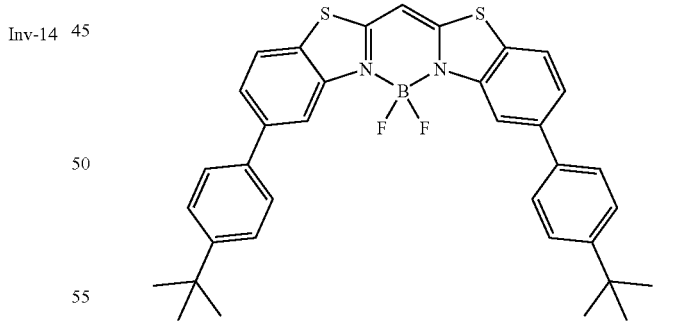
Inv-20
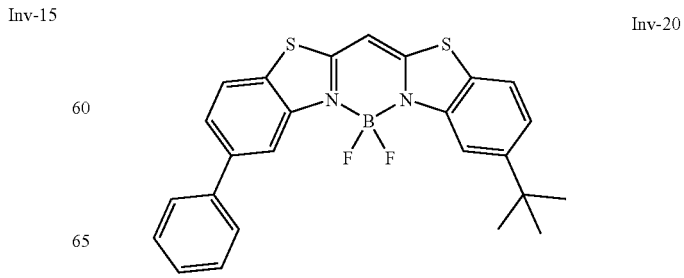

Inv-21
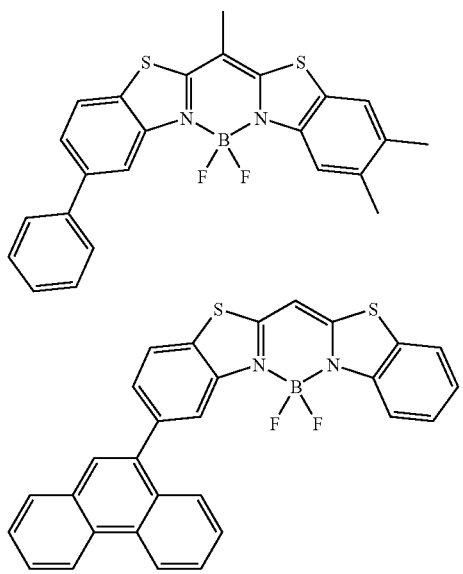
Inv-22
Illustrative examples of anthracene compounds useful in the present invention include the following compounds.
An-1
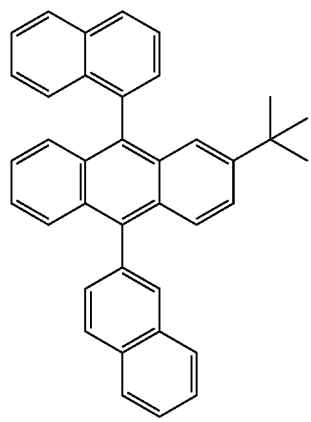
An-2
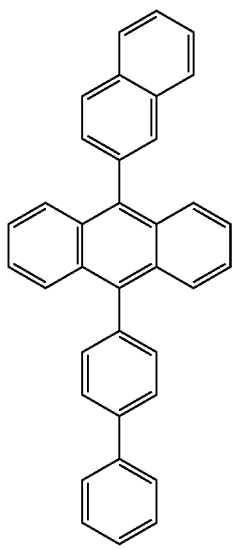
An-3
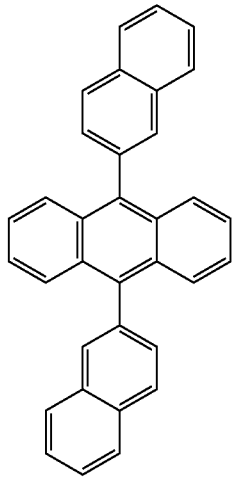
An-4
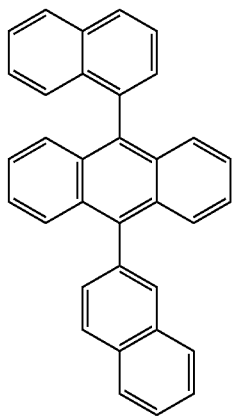
An-5
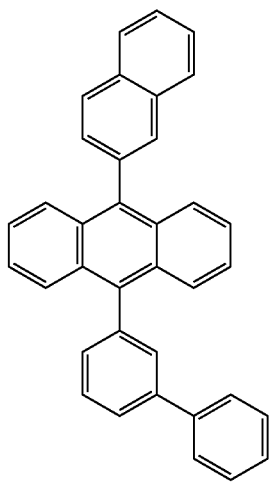

An-6 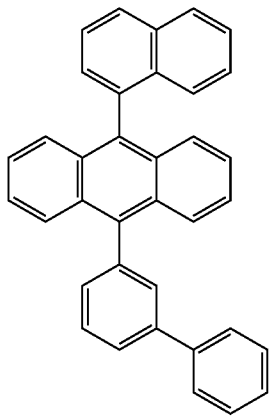

An-7 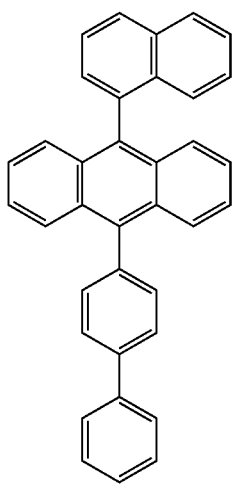

An-8 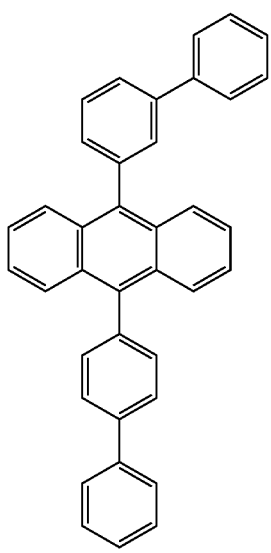

An-9 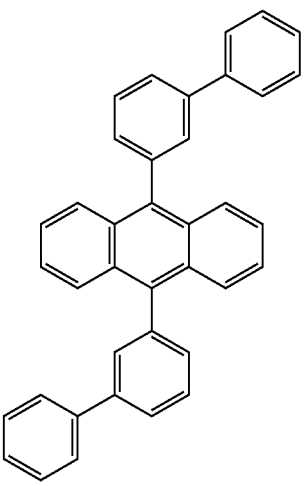

An-10 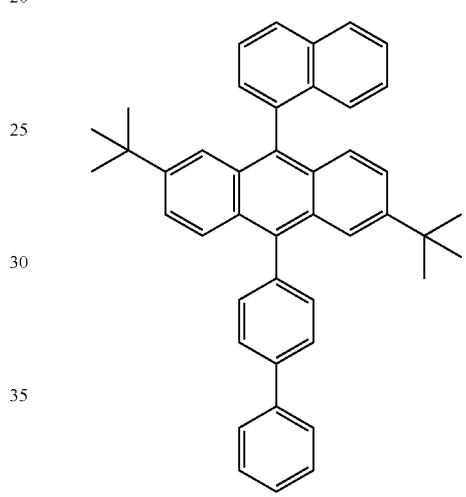

In another desirable embodiment, an electron-transporting layer contiguous to the light-emitting layer and located between the light-emitting layer and the cathode contains an electron-transporting polycyclic aromatic hydrocarbon having 14-50 carbon atoms. Especially useful polycyclic aromatic hydrocarbons include anthracene derivatives and fluoranthene derivatives.

Useful anthracene derivatives include those according to Formula (IVa).

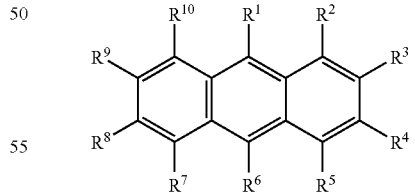

Formula (IVa)

In Formula (IVa), $R^1$ and $R^6$ each independently represent an aryl group containing from 6 to 24 carbon atoms such as a phenyl group or a naphthyl group. $R^2$-$R^5$ and $R^7$-$R^{10}$ are each independently chosen from hydrogen, alkyl groups containing from 1 to 24 carbon atoms or aromatic groups containing from 6 to 24 carbon atoms.

In one suitable embodiment $R^1$ and $R^6$ each represent an independently selected phenyl group, biphenyl group, or naphthyl group. $R^3$ represents a hydrogen, a phenyl, or naphthyl group. $R^2$, $R^4$, $R^5$, $R^7$-$R^{10}$ represent hydrogen.

Illustrative examples of useful electron-transporting anthracene derivatives are listed below.
P-1
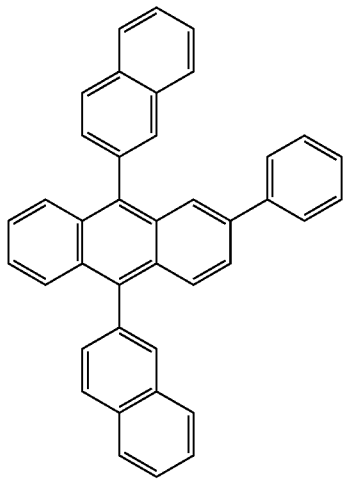
P-2
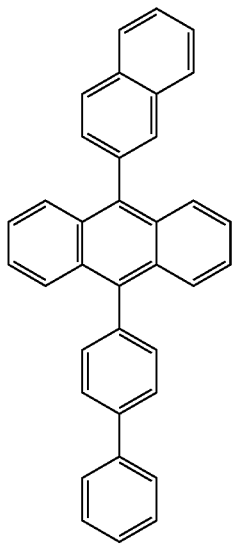
P-3
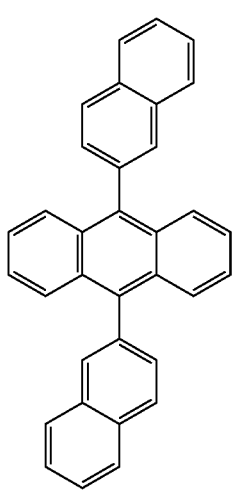
P-4
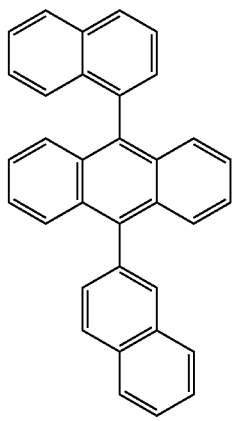
P-5
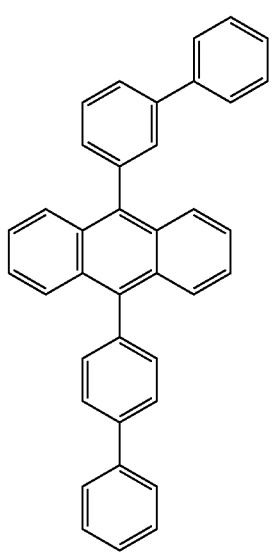
P-6
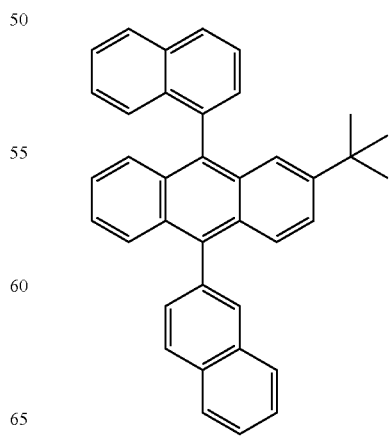

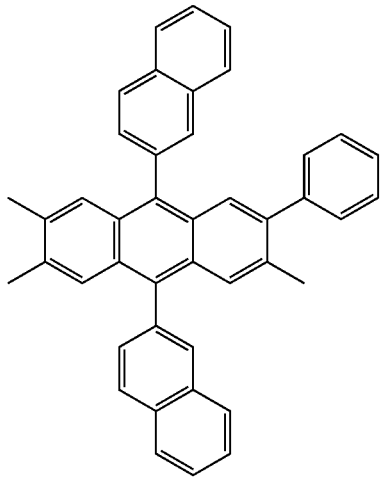

P-7

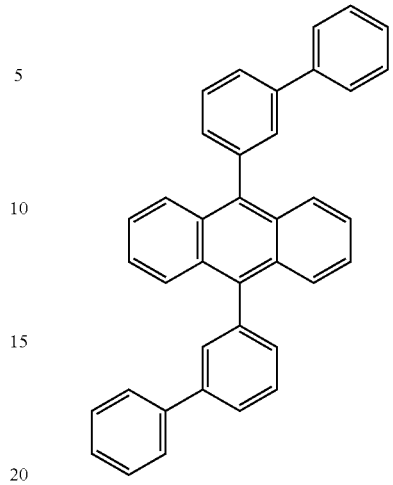

P-10

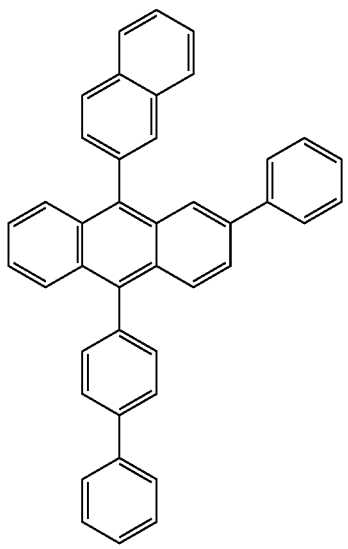

P-8

Fluoranthenes according to Formula (IVb) are also useful electron-transporting polycyclic aromatic hydrocarbon compounds.

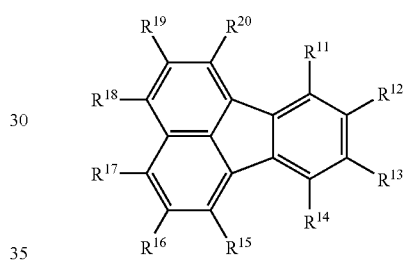

Formula (IVb)

In Formula (IVb), $R^{11}$-$R^{20}$ are independently chosen from hydrogen, alkyl groups containing from 1 to 24 carbon atoms or aromatic groups containing from 6 to 24 carbon atoms provided adjacent groups can combine to form ring groups. In one desirable embodiment, $R^{11}$ and $R^{14}$ represent aryl groups and $R^{12}$, $R^{13}$ and $R^{15}$-$R^{20}$ are independently chosen from hydrogen, alkyl groups containing from 1 to 24 carbon atoms or aromatic groups containing from 6 to 24 carbon atoms provided adjacent groups cannot combine to form aromatic ring groups.

Especially suitable fluoranthene derivatives are those described in U.S. patent application Ser. No. 11/924,631, filed Oct. 26, 2007 of William J. Begley et al., entitled OLED Device With Fluoranthene Electron Transport Materials. For example, 7,10-diaryl-fluoranthene derivatives represented according to Formulae (IVc) and (IVd) are useful.

P-9

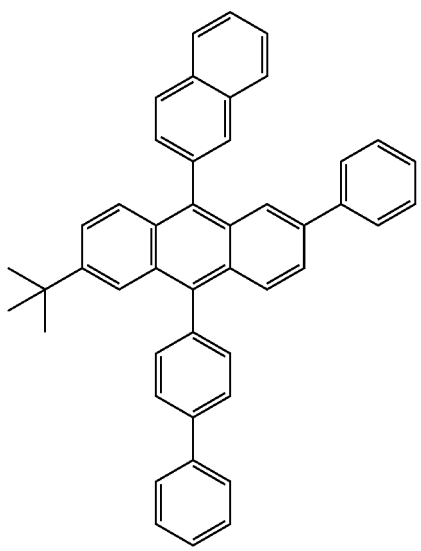

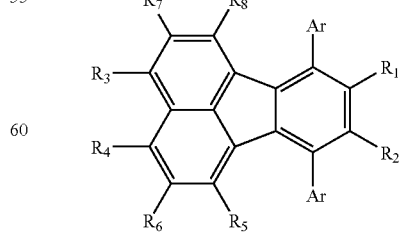

Formula (IVc)

In Formula (IVc), Ar represents aromatic rings containing 6 to 24 carbon atoms substituted on the fluoranthene nucleus and can be the same or different; and $R_1$-$R_8$ are individually selected from hydrogen and aromatic rings containing 6 to 24 carbon atoms with the proviso that no two adjacent $R_1$-$R_8$ substituents can join to form a ring annulated to the fluoranthene nucleus.

In Formula (IVc), the Ar group(s) are carbocyclic groups. The Ar group(s) cannot be fused with the fluoranthene nucleus and are connected only by one single bond. Preferred Ar groups are phenyl or napthyl with phenyl being particularly preferred. Derivatives where the Ar groups are the same are also desirable.

Formula (IVd)

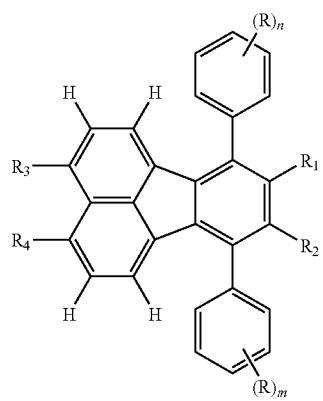

In Formula (IVd), $R_1$, $R_2$, $R_3$ and $R_4$ are independently hydrogen or an aromatic group containing 6 to 24 carbon atoms with the proviso that any adjacent $R_1$-$R_4$ is not part of an annulated aromatic ring system; R is hydrogen or an optional substituent; and n and m are independently 0-5.

In some embodiments, it can be desirable to use isomeric mixtures of fluoranthene derivatives. The mixture can prevent undesirable crystallization.

Illustrative examples of useful electron-transporting fluoranthene derivatives are shown below.

FA-1

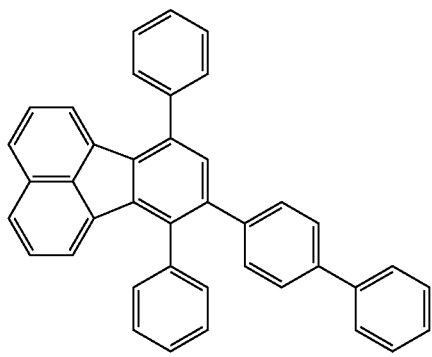

FA-2

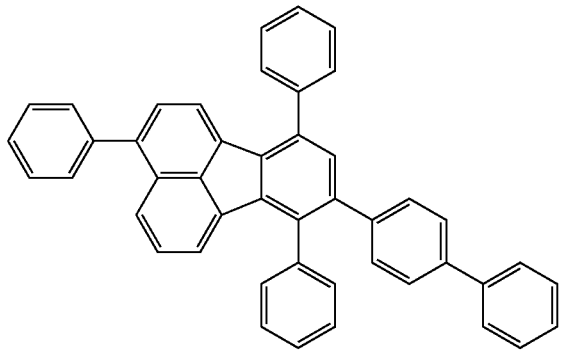

FA-3

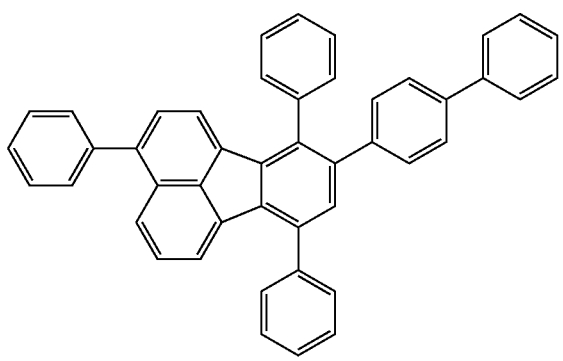

FA-4

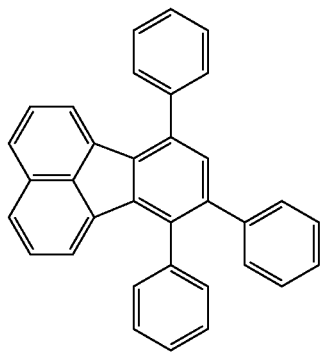

FA-5

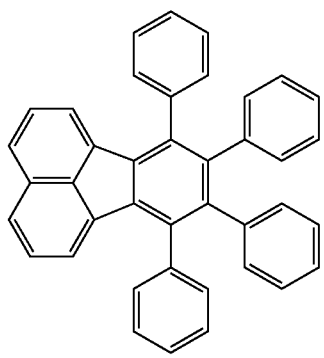

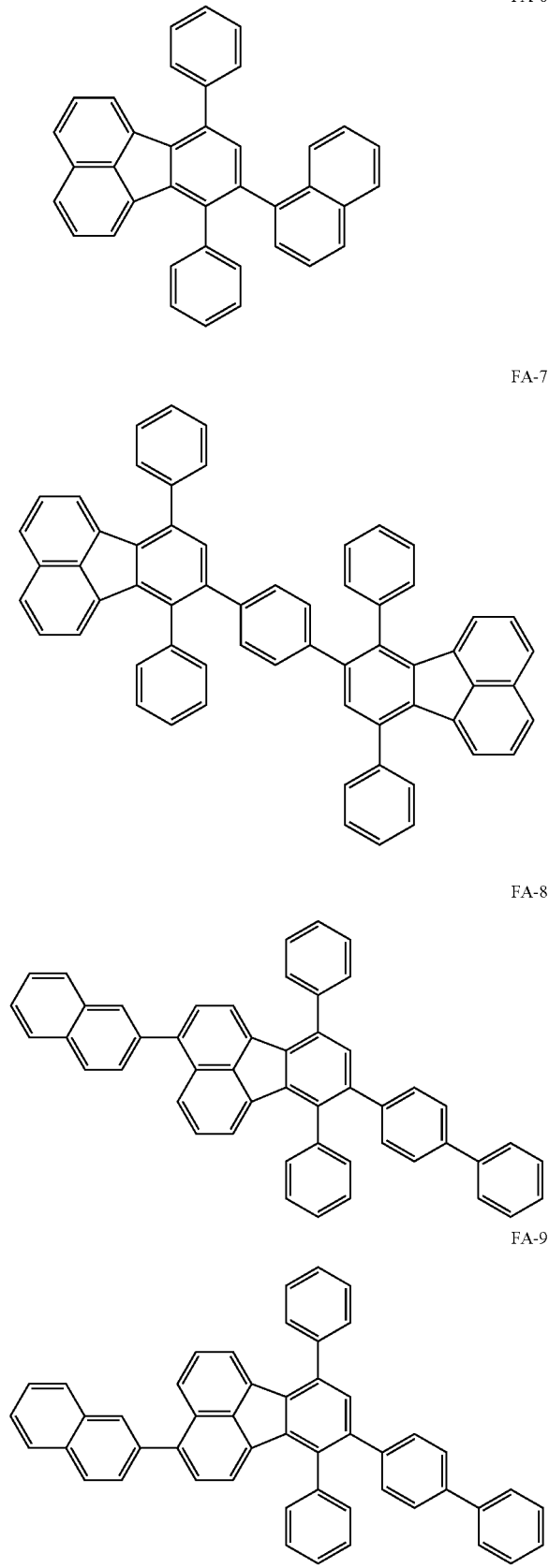

In a further embodiment, the electron-transporting layer containing the electron-transporting polycyclic aromatic hydrocarbon also contains at least one material chosen from alkali metals, alkali metal compounds, alkaline earth metals, or alkaline earth metal compounds, or combinations thereof. The % volume ratio of alkali metal to polycyclic aromatic hydrocarbon can be anywhere from 0.1% to 10%, typically 0.5% to 8%, suitably 0.5% to 5%. The % volume ratio of alkali metal compound to polycyclic aromatic hydrocarbon can be anywhere from 0.1% to 99%, typically 0.5% to 95%, more suitably 10% to 90% and most desirably, 30 to 70%. The electron-transporting layer can include additional materials.

Alkali metals belong to Group 1 of the periodic table. Of these, lithium is highly preferred. The alkali metal compound can be inorganic or an organometallic compound. For example, inorganic lithium materials such as Li metal or LiF are particularl useful. Useful alkali metal compounds include organic lithium compounds according to Formula (V).

$$(Li^+)_m(Q)_n \qquad \text{Formula (V)}$$

In Formula (V), Q is an anionic organic ligand; and m and n are independently selected integers selected to provide a neutral charge on the complex.

The anionic organic ligand Q is most suitably monoanionic and contains at least one ionizable site consisting of oxygen, nitrogen or carbon. In the case of enolates or other tautomeric systems containing oxygen, it will be considered and drawn with the lithium bonded to the oxygen although the lithium can, in fact, be bonded elsewhere to form a chelate. It is also desirable that the ligand contains at least one nitrogen atom that can form a coordinate or dative bond with the lithium. The integers m and n can be greater than 1 reflecting a known propensity for some organic lithium compounds to form cluster complexes.

Useful alkali metal compounds also include organic lithium compounds according to Formula (VI).

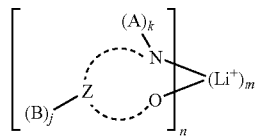

Formula (VI)

In Formula (VI), Z and the dashed arc represent two to four atoms and the bonds necessary to complete a 5- to 7-membered ring with the lithium cation; each A represents hydrogen or a substituent and each B represents hydrogen or an independently selected substituent on the Z atoms, provided that two or more substituents can combine to form a fused ring or a fused ring system; and j is 0-3 and k is 1 or 2; and m and n are independently selected integers selected to provide a neutral charge on the complex.

Of compounds of Formula (VI), it is most desirable that the A and B substituents together form an additional ring system. This additional ring system can further contain additional heteroatoms to form a multidentate ligand with coordinate or dative bonding to the lithium. Desirable heteroatoms are nitrogen or oxygen.

In Formula (VI), it is preferred that the oxygen shown is part of a hydroxyl, carboxy or keto group. Examples of suitable nitrogen ligands are 8-hydroxyquinoline, 2-hydroxymethylpyridine, pipecolinic acid or 2-pyridinecarboxylic acid.

Illustrative examples of useful organic alkali metal compounds include the following.

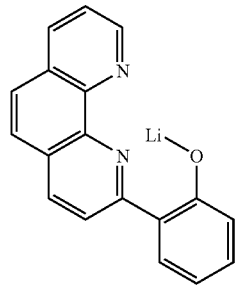

AM-1

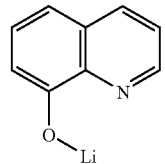

AM-2

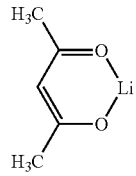

AM-3

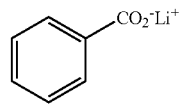

AM-4

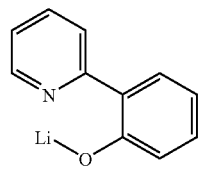

AM-5

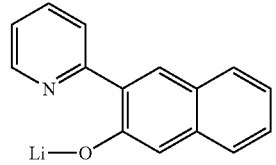

AM-6

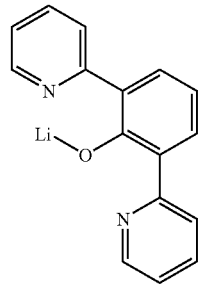

AM-7

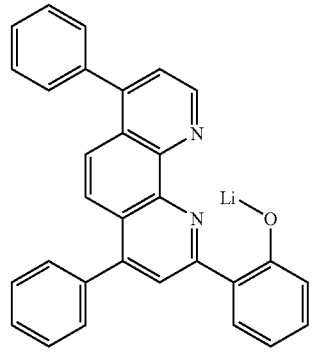

AM-8

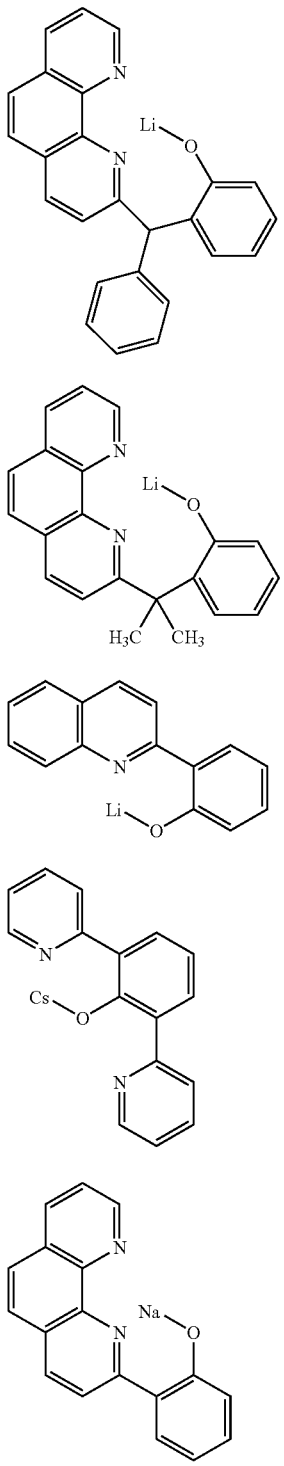

AM-9

AM-10

AM-11

AM-12

AM-13

FIG. 1 shows one embodiment of the invention in which a light-emitting layer (LEL) 134, an electron-transporting layer (ETL) 136 and an electron-injecting layer 138 (EIL) are present. An optional hole-blocking layer (HBL) 135 is shown between the light-emitting layer and the electron-transporting layer. The figure also shows an optional hole-injecting layer (HIL)130. In another embodiment, there is no hole-blocking layer (HBL) 135 located between the ETL 136 and the LEL 134. In yet other embodiments, the electron-injecting layer (ETL) 136 can be subdivided into two or more sublayers (not shown).

In one illustrative example, the OLED device has no hole-blocking layer and only one hole-injecting, electron-injecting and electron-transporting layer. The boron complex of Formula (I) and the anthracene of Formula (III) are present in the LEL 134, and an electron-transporting polycyclic aromatic hydrocarbon compound of Formula (IVa) along with an alkali metal compound of Formula (V) are present in the ETL 136.

Examples of preferred combinations of the invention are those wherein the boron complex is selected from Inv-1, Inv-2, Inv-3, Inv-4, and Inv-5 or mixtures thereof; the anthracene compound is selected from An-1, An-2, An-3, and An-4, or mixtures thereof; the polycyclic aromatic electron-transporting compound (when present) is selected from P-1, P-2, P-3, P-4, FA-1, FA-2/FA-3, FA-4, or mixtures thereof; and the alkali metal or alkali metal compound (when present) is selected from Li metal, LiF, AM-1, AM-2 and AM-3 or mixtures thereof.

In one suitable embodiment the EL device includes a technique for emitting white light, which can include complimentary emitters, a white emitter, or a filtering technique. This invention can be used in so-called stacked device architecture, for example, as taught in U.S. Pat. Nos. 5,703,436 and 6,337,492. Embodiments of the current invention can be used in stacked devices that includes solely fluorescent elements to produce white light. The device can also include combinations of fluorescent emitting materials and phosphorescent emitting materials (sometimes referred to as hybrid OLED devices). To produce a white emitting device, ideally the hybrid fluorescent/phosphorescent device would includes a blue fluorescent emitter and proper proportions of a green and red phosphorescent emitter, or other color combinations suitable to make white emission. However, hybrid devices having non-white emission can also be useful by themselves. Hybrid fluorescent/phosphorescent elements having non-white emission can also be combined with additional phosphorescent elements in series in a stacked OLED. For example, white emission can be produced by one or more hybrid blue fluorescent/red phosphorescent elements stacked in series with a green phosphorescent element using p/n junction connectors as disclosed in Tang et al. U.S. Pat. No. 6,936,961.

In one desirable embodiment the EL device is part of a display device. In another suitable embodiment the EL device is part of an area lighting device.

The EL device of the invention is useful in any device where stable light emission is desired such as a lamp or a component in a static or motion imaging device, such as a television, cell phone, DVD player, or computer monitor.

As used herein and throughout this application, the term carbocyclic and heterocyclic rings or groups are generally as defined by the *Grant & Hackh's Chemical Dictionary*, Fifth Edition, McGraw-Hill Book Company. A carbocyclic ring is any aromatic or non-aromatic ring system containing only carbon atoms and a heterocyclic ring is any aromatic or non-aromatic ring system containing both carbon and non-carbon atoms such as nitrogen (A), oxygen (O), sulfur (S), phosphorous (P), silicon (Si), gallium (Ga), boron (B), beryllium (Be), indium (In), aluminum (Al), and other elements found in the periodic table useful in forming ring systems. For the purpose of this invention, also included in the definition of a heterocyclic ring are those rings that include coordinate bonds. The definition of a coordinate or dative bond can be found in *Grant & Hackh s Chemical Dictionary*, pages 91 and 153. In essence, a coordinate bond is formed when electron rich atoms such as O or N, donate a pair of electrons to electron deficient atoms or ions such as aluminum, boron or alkali metal ions such Li+, Na+, K+ and Cs+. One such example is found in tris(8-quinolinolato)aluminum(III), also referred to as Alq, wherein the nitrogen on the quinoline moiety donates its lone pair of electrons to the aluminum atom thus forming the heterocycle and hence providing Alq with a total of 3 fused rings. The definition of a ligand, including a multidentate ligand, can be found in *Grant & Hackh's Chemical Dictionary*, pages 337 and 176, respectively.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group can be halogen or can be bonded to the remainder of the molecule by an atom of carbon, silicon, oxygen, nitrogen, phosphorous, sulfur, selenium, or boron. The substituent can be, for example, halogen, such as chloro, bromo or fluoro; nitro; hydroxyl; cyano; carboxyl; or groups which can be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl) ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which can be substituted and which contain a 3 to 7 membered heterocyclic ring composed of carbon atoms and at least one hetero atom selected from the group consisting of oxygen, nitrogen, sulfur, phosphorous, or boron, such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents can themselves be further substituted one or more times with the described substituent groups. The particular substituents used can be selected by those skilled in the art to attain the desired desirable properties for a specific application and can include, for example, electron-withdrawing groups, electron-donating groups, and steric groups. When a molecule can have two or more substituents, the substituents can be joined together to form a ring such as a fused ring unless otherwise provided. Generally, the above groups and substituents thereof can include those having up to 48 carbon atoms, typically 1 to 36 carbon atoms and usually less than 24 carbon atoms, but greater numbers are possible depending on the particular substituents selected.

The following is the description of the layer structure, material selection, and fabrication process for OLED devices.

General OLED Device Architecture

The present invention can be employed in many OLED configurations using small molecule materials, oligomeric materials, polymeric materials, or combinations thereof. These include from very simple structures having a single anode and cathode to more complex devices, such as passive matrix displays having orthogonal arrays of anodes and cathodes to form pixels, and active-matrix displays where each pixel is controlled independently, for example, with thin film transistors (TFTs). There are numerous configurations of the organic layers wherein the present invention is successfully practiced. For this invention, essential requirements are a cathode, an anode, a LEL, an ETL and a HIL.

As described previously, one embodiment according to the present invention and especially useful for a small molecule device is shown in FIG. 1. OLED 100 contains a substrate 110, an anode 120, a hole-injecting layer 130, a hole-transporting layer 132, a light-emitting layer 134, a hole-blocking layer 135, an electron-transporting layer 136, an electron-injecting layer 138 and a cathode 140. In some other embodiments, there are optional spacer layers on either side of the LEL. These spacer layers do not typically contain light emissive materials. All of these layer types will be described in detail below. Note that the substrate can alternatively be located adjacent to the cathode, or the substrate can actually constitute the anode or cathode. Also, the total combined thickness of the organic layers is preferably less than 500 nm.

The anode and cathode of the OLED are connected to a voltage/current source 150, through electrical conductors 160. Applying a potential between the anode 120 and cathode 140 such that the anode 120 is at a more positive potential than the cathode 140 operates the OLED. Holes are injected into the organic EL element from the anode. Enhanced device stability can sometimes be achieved when the OLED is operated in an AC mode where, for some time period in cycle, the potential bias is reversed and no current flows. An example of an AC driven OLED is described in U.S. Pat. No. 5,552, 678.

Anode

When the desired EL emission is viewed through the anode, anode 120 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 120. For applications where EL emission is viewed only through the cathode 140, the transmissive characteristics of the anode 120 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable technique such as evaporation, sputtering, chemical vapor deposition, or electrochemical technique. Anodes can be patterned using well-known photolithographic processes. Optionally, anodes can be polished prior to application of other layers to reduce surface roughness so as to reduce short circuits or enhance reflectivity.

Hole Injection Layer

Although it is not always necessary, it is often useful to provide an HIL in the OLEDs. HIL 130 in the OLEDs can serve to facilitate hole injection from the anode into the HTL, thereby reducing the drive voltage of the OLEDs. Suitable materials for use in HIL 130 include, but are not limited to, porphyrinic compounds as described in U.S. Pat. No. 4,720, 432 and some aromatic amines, for example, 4,4',4''-tris[(3-ethylphenyl)phenylamino]triphenylamine (m-TDATA). Alternative hole-injecting materials reportedly useful in OLEDs are described in EP 0891121A1 and EP 1029909A1. Aromatic tertiary amines discussed below can also be useful as hole-injecting materials. Other useful hole-injecting materials such as dipyrazino[2,3-f:2',3'-h]quinoxalinehexacarbonitrile are described in U.S. Patent Application Publication No. 2004/0113547 A1 and U.S. Pat. No. 6,720,573. In addition, a p-type doped organic layer is also useful for the HIL as described in U.S. Pat. No. 6,423,429. The term "p-type doped organic layer" indicates that this layer has semiconducting properties after doping, and the electrical current through this layer is substantially carried by the holes. The conductivity is provided by the formation of a charge-transfer complex as a result of hole transfer from the dopant to the host material.

The thickness of the HIL 130 is in the range of from 0.1 nm to 200 nm, preferably, in the range of from 0.5 nm to 150 nm.

Hole Transport Layer

The HTL 132 contains at least one hole-transporting material such as an aromatic tertiary amine, where the latter is understood to be a compound containing at least one trivalent nitrogen atom that is bonded only to carbon atoms, at least one of which is a member of an aromatic ring. In one form the aromatic tertiary amine is an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals or at least one active hydrogen-containing group are disclosed by Brantley, et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula (A)

(A)

wherein:
$Q_1$ and $Q_2$ are independently selected aromatic tertiary amine moieties; and
G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula (B)

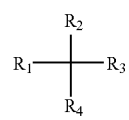

(B)

wherein:
$R_1$ and $R_2$ each independently represents a hydrogen atom, an aryl group, or an alkyl group or $R_1$ and $R_2$ together represent the atoms completing a cycloalkyl group; and
$R_3$ and $R_4$ each independently represents an aryl group, which is in turn substituted with a diaryl substituted amino group, as indicated by structural Formula (C)

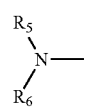

(C)

wherein:
$R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula (C), linked through an arylene group. Useful tetraaryldiamines include those represented by Formula (D)

wherein:
  each ARE is an independently selected arylene group, such as a phenylene or anthracene moiety;
  n is an integer of from 1 to 4; and
  Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene.

Another class of the hole-transporting material includes a material of Formula (E):

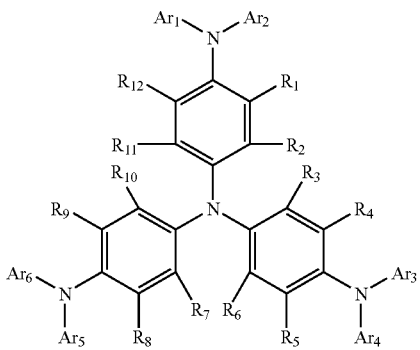

In Formula (E), $Ar_1$-$Ar_6$ independently represent aromatic groups, for example, phenyl groups or tolyl groups; $R_1$-$R_{12}$ independently represent hydrogen or independently selected substituent, for example an alkyl group containing from 1 to 4 carbon atoms, an aryl group, a substituted aryl group.

The various alkyl, alkylene, aryl, and arylene moieties of the foregoing structural Formulae (A), (B), (C), (D), and (E) can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, e.g. cyclopentyl, cyclohexyl, and cycloheptyl ring structures. The aryl and arylene moieties are typically phenyl and phenylene moieties.

The HTL is formed of a single or a mixture of aromatic tertiary amine compounds. Specifically, one can employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylamine and the electron injecting and transporting layer. Aromatic tertiary amines are useful as hole-injecting materials also. Illustrative of useful aromatic tertiary amines are the following:
  1,1-bis(4-di-p-tolylaminophenyl)cyclohexane;
  1,1-bis(4-di-p-tolylaminophenyl)-4-phenylcyclohexane;
  1,5-bis[N-(1-naphthyl)-N-phenylamino]naphthalene;
  2,6-bis(di-p-tolylamino)naphthalene;
  2,6-bis[di-(1-naphthyl)amino]naphthalene;
  2,6-bis[N-(1-naphthyl)-N-(2-naphthyl)amino]naphthalene;
  2,6-bis[N,N-di(2-naphthyl)amine]fluorene;
  4-(di-p-tolylamino)-4'-[4(di-p-tolylamino)-styryl]stilbene;
  4,4'-bis(diphenylamino)quadriphenyl;
  4,4"-bis[N-(1-anthryl)-N-phenylamino]-p-terphenyl;
  4,4'-bis[N-(1-coronenyl)-N-phenylamino]biphenyl;
  4,4'-bis[N-(1-naphthyl)-N-phenylamino]biphenyl (NPB);
  4,4'-bis[N-(1-naphthyl)-N-(2-naphthyl)amino]biphenyl (TNB);
  4,4"-bis[N-(1-naphthyl)-N-phenylamino]p-terphenyl;
  4,4'-bis[N-(2-naphthacenyl)-N-phenylamino]biphenyl;
  4,4'-bis[N-(2-naphthyl)-N-phenylamino]biphenyl;
  4,4'-bis[N-(2-perylenyl)-N-phenylamino]biphenyl;
  4,4'-bis[N-(2-phenanthryl)-N-phenylamino]biphenyl;
  4,4'-bis[N-(2-pyrenyl)-N-phenylamino]biphenyl;
  4,4'-bis[N-(3-acenaphthenyl)-N-phenylamino]biphenyl;
  4,4'-bis[N-(3-methylphenyl)-N-phenylamino]biphenyl (TPD);
  4,4'-bis[N-(8-fluoranthenyl)-N-phenylamino]biphenyl;
  4,4'-bis[N-(9-anthryl)-N-phenylamino]biphenyl;
  4,4'-bis {N-phenyl-N-[4-(1-naphthyl)-phenyl]amino}biphenyl;
  4,4'-bis[N-phenyl-N-(2-pyrenyl)amino]biphenyl;
  4,4',4"-tris[(3-methylphenyl)phenylamino]triphenylamine (m-TDATA);
  Bis(4-dimethylamino-2-methylpheny)-phenylmethane;
  N-phenylcarbazole;
  N,N'-bis[4-([1,1'-biphenyl]-4-ylphenylamino)phenyl]-N,N'-di-1-naphthalenyl-[1,1'-biphenyl]-4,4'-diamine;
  N,N'-bis[4-(di-1-naphthalenylamino)phenyl]-N,N'-di-1-naphthalenyl-[1,1'-biphenyl]-4,4'-diamine;
  N,N'-bis[4-[(3-methylphenyl)phenylamino]phenyl]-N,N'-diphenyl-[1,1'-biphenyl]-4,4'-diamine;
  N,N-bis[4-(diphenylamino)phenyl]-N,N'-diphenyl-[1,1'-biphenyl]-4,4'-diamine;
  N,N'-di-1-naphthalenyl-N,N'-bis[4-(1-naphthalenylphenylamino)phenyl]-[1,1-biphenyl]-4,4'-diamine;
  N,N'-di-1-naphthalenyl-N,N'-bis[4-(2-naphthalenylphenylamino)phenyl]-[1,1'-biphenyl]-4,4'-diamine;
  N,N,N-tri(p-tolyl)amine;
  N,N,N',N'-tetra-p-tolyl-4-4'-diaminobiphenyl;
  N,N,N',N'-tetraphenyl-4,4'-diaminobiphenyl;
  N,N,N',N'-tetra-1-naphthyl-4,4'-diaminobiphenyl;
  N,N,N',N'-tetra-2-naphthyl4,4'-diaminobiphenyl; and
  N,N,N',N'-tetra(2-naphthyl)4,4"-diamino-p-terphenyl.

Another class of useful hole-transporting materials includes polycyclic aromatic compounds as described in EP 1009 041. Tertiary aromatic amines with more than two amine groups can be used including oligomeric materials. In addition, polymeric hole-transporting materials are used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

The thickness of the HTL 132 is in the range of from 5 nm to 200 nm, preferably, in the range of from 10 nm to 150 nm.

Exciton Blocking Layer (EBL)

An optional exciton- or electron-blocking layer can be present between the HTL and the LEL (not shown in FIG. 1). Some suitable examples of such blocking layers are described in U.S. Patent Application Publication No. 2006/0134460A1.

Light-Emitting Layer (LEL)

In addition to the light-emitting materials of this invention, additional light emitting materials can be used in the EL device, including other fluorescent materials. In some embodiments, other fluorescent or phosphorescent materials can be used in the same layer as the boron complex and anthracene compound, in adjacent layers, in adjacent pixels, or any combination.

As more fully described in U.S. Pat. Nos. 4,769,292 and 5,935,721, the light-emitting layer(s) (LEL) 134 of the organic EL element shown in FIG. 1 includes a luminescent, fluorescent or phosphorescent material where electroluminescence is produced as a result of electron-hole pair recombination in this region. The light-emitting layer can include a single material, but more commonly includes non-electroluminescent compounds (generally referred to as the host) doped with an electroluminescent guest compound (generally referred to as the dopant) or compounds where light emission comes primarily from the electroluminescent compound and can be of any color. Electroluminescent compounds can be coated as 0.01 to 50% into the non-electroluminescent component material, but typically coated as 0.01 to 30% and more typically coated as 0.01 to 15% into the non-electroluminescent component. The thickness of the LEL can be any suitable thickness. It can be in the range of from 0.1 mm to 100 mm.

An important relationship for choosing a dye as an electroluminescent component is a comparison of the bandgap potential which is defined as the energy difference between the highest occupied molecular orbital and the lowest unoccupied molecular orbital of the molecule. For efficient energy transfer from the non-electroluminescent compound to the electroluminescent compound molecule, a necessary condition is that the band gap of the electroluminescent compound is smaller than that of the non-electroluminescent compound or compounds. Thus, the selection of an appropriate host material is based on its electronic characteristics relative to the electronic characteristics of the electroluminescent compound, which itself is chosen for the nature and efficiency of the light emitted. As described below, fluorescent and phosphorescent dopants typically have different electronic characteristics so that the most appropriate hosts for each can be different. However in some cases, the same host material can be useful for either type of dopant.

Non-electroluminescent compounds and emitting molecules known to be of use include, but are not limited to, those disclosed in U.S. Pat. Nos. 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

(a) Phosphorescent Light Emitting Layers

Suitable hosts for phosphorescent LELs should be selected so that transfer of a triplet exciton can occur efficiently from the host to the phosphorescent dopant(s) but cannot occur efficiently from the phosphorescent dopant(s) to the host. Therefore, it is highly desirable that the triplet energy of the host be higher than the triplet energies of phosphorescent dopant. Generally speaking, a large triplet energy implies a large optical band gap. However, the band gap of the host should not be chosen so large as to cause an unacceptable barrier to injection of holes into the fluorescent blue LEL 134 and an unacceptable increase in the drive voltage of the OLED. The host in a phosphorescent LEL 134 can include any of the aforementioned hole-transporting material used for the HTL 132, as long as it has a triplet energy higher than that of the phosphorescent dopant in the layer. The host used in a phosphorescent LEL 134 can be the same as or different from the hole-transporting material used in the HTL 132. In some cases, the host in the phosphorescent LEL 134 can also suitably include an electron-transporting material (it will be discussed thereafter), as long as it has a triplet energy higher than that of the phosphorescent dopant.

In addition to the aforementioned hole-transporting materials in the HTL 132, there are several other classes of hole-transporting materials suitable for use as the host in a phosphorescent LEL 134.

One desirable host includes a hole-transporting material of Formula (F):

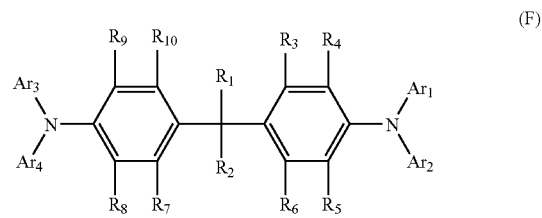

(F)

In Formula (F), $R_1$ and $R_2$ represent substituents, provided that $R_1$ and $R_2$ can join to form a ring. For example, $R_1$ and $R_2$ can be methyl groups or join to form a cyclohexyl ring;

$Ar_1$-$Ar_4$ represent independently selected aromatic groups, for example phenyl groups or tolyl groups;

$R_3$-$R_{10}$ independently represent hydrogen, alkyl, substituted alkyl, aryl, substituted aryl group.

Examples of suitable materials include, but are not limited to:

1,1-Bis(4-(N,N-di-p-tolylamino)phenyl)cyclohexane (TAPC);
1,1-Bis(4-(N,N-di-p-tolylamino)phenyl)cyclopentane;
4,4'-(9H-fluoren-9-ylidene)bis[[N,N-bis(4-methylphenyl)-benzenamine;
1,1-Bis(4-(N,N-di-p-tolylamino)phenyl)-4-phenylcyclohexane;
1,1-Bis(4-(N,N-di-p-tolylamino)phenyl)-4-methylcyclohexane;
1,1-Bis(4-(N,N-di-p-tolylamino)phenyl)-3-phenylpropane;
Bis[4-(N,N-diethylamino)-2-methylphenyl](4-methylphenyl)methane;
Bis[4-(N,N-diethylamino)-2-methylphenyl](4-methylphenyl)ethane;
4-(4-Diethylaminophenyl)triphenylmethane;
4,4'-Bis(4-diethylaminophenyl)diphenylmethane.

A useful class of triarylamines suitable for use as the host includes carbazole derivatives such as those represented by Formula (G):

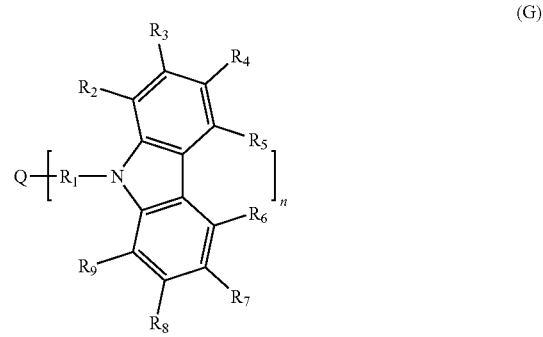

(G)

In Formula (G), Q independently represents nitrogen, carbon, an aryl group, or substituted aryl group, preferably a phenyl group;

$R_1$ is preferably an aryl or substituted aryl group, and more preferably a phenyl group, substituted phenyl, biphenyl, substituted biphenyl group;

$R_2$ through $R_7$ are independently hydrogen, alkyl, phenyl or substituted phenyl group, aryl amine, carbazole, or substituted carbazole;

and n is selected from 1 to 4.

Another useful class of carbazoles satisfying structural Formula (G) is represented by Formula (H):

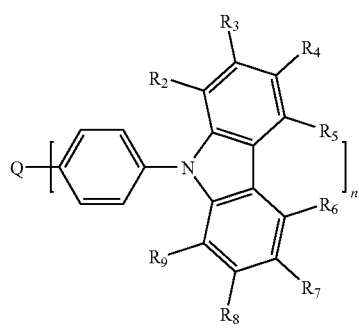

(H)

wherein:

n is an integer from 1 to 4;

Q is nitrogen, carbon, an aryl, or substituted aryl;

$R_2$ through $R_7$ are independently hydrogen, an alkyl group, phenyl or substituted phenyl, an aryl amine, a carbazole and substituted carbazole.

Illustrative of useful substituted carbazoles are the following:

4-(9H-carbazol-9-yl)-N,N-bis[4-(9H-carbazol-9-yl)phenyl]-benzenamine (TCTA);

4-(3-phenyl-9H-carbazol-9-yl)-N,N-bis[4(3-phenyl-9H-carbazol-9-yl)phenyl]-benzenamine;

9,9'-[5'-[4-(9H-carbazol-9-yl)phenyl][1,1':3',1''-terphenyl]-4,4''diyl]bis-9H-carbazole.

9,9'-(2,2'-dimethyl[1,1'-biphenyl]-4,4'-diyl)bis-9H-carbazole (CDBP);

9,9'-[1,1'-biphenyl]-4,4'-diylbis-9H-carbazole (CBP);

9,9'-(1,3-phenylene)bis-9H-carbazole (mCP);

9,9'-(1,4-phenylene)bis-9H-carbazole;

9,9',9''-(1,3,5-benzenetriyl)tris-9H-carbazole;

9,9'-(1,4-phenylene)bis[N,N,N',N'-tetraphenyl-9H-carbazole-3,6-diamine;

9-[4-(9H-carbazol-9-yl)phenyl]-N,N-diphenyl-9H-carbazol-3-amine;

9,9'-(1,4-phenylene)bis[N,N-diphenyl-9H-carbazol-3-amine;

9-[4-(9H-carbazol-9-yl)phenyl]-N,N,N',N'-tetraphenyl-9H-carbazole-3,6-diamine.

The above classes of hosts suitable for phosphorescent LELs can also be used as hosts in fluorescent LELs as well.

Suitable phosphorescent dopants for use in a phosphorescent LEL can be selected from the phosphorescent materials described by Formula (J) below:

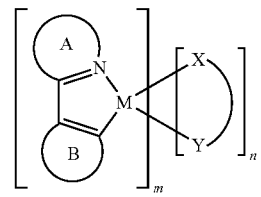

(J)

wherein:

A is a substituted or unsubstituted heterocyclic ring containing at least one nitrogen atom;

B is a substituted or unsubstituted aromatic or heteroaromatic ring, or ring containing a vinyl carbon bonded to M;

X—Y is an anionic bidentate ligand;

m is an integer from 1 to 3 and n in an integer from 0 to 2 such that m+n=3 for M=Rh or Ir; or m is an integer from 1 to 2 and n in an integer from 0 to 1 such that m+n=2 for M=Pt or Pd.

Compounds according to Formula (J) can be referred to as C,N— (or C^N—) cyclometallated complexes to indicate that the central metal atom is contained in a cyclic unit formed by bonding the metal atom to carbon and nitrogen atoms of one or more ligands. Examples of heterocyclic ring A in Formula (J) include substituted or unsubstituted pyridine, quinoline, isoquinoline, pyrimidine, indole, indazole, thiazole, and oxazole rings. Examples of ring B in Formula (J) include substituted or unsubstituted phenyl, napthyl, thienyl, benzothienyl, furanyl rings. Ring B in Formula (J) can also be a N-containing ring such as pyridine, with the proviso that the N-containing ring bonds to M through a C atom as shown in Formula (J) and not the N atom.

An example of a tris-C,N-cyclometallated complex according to Formula (J) with m=3 and n=0 is tris(2-phenylpyridinato-N,C²'—)Iridium (III), shown below in stereodiagrams as facial (fac-) or meridional (mer-) isomers.

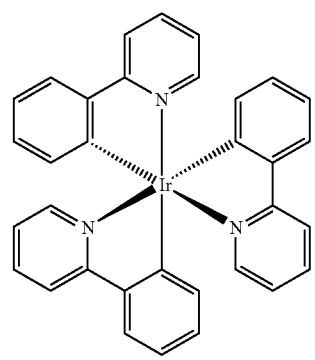

Fac

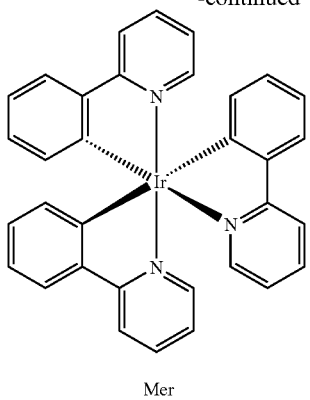

Mer

Generally, facial isomers are preferred since they are often found to have higher phosphorescent quantum yields than the meridional isomers. Additional examples of tris-C,N-cyclometallated phosphorescent materials according to Formula (I) are tris(2-(4'-methylphenyl)pyridinato-N,C$^{2'}$)Iridium(IR), tris(3-phenylisoquinolinato-N,C$^{2'}$)Iridium(III), tris(2-phenylquinolinato-N,C$^{2'}$)Iridium(M), tris(1-phenylisoquinolinato-N,C$^{2'}$)Iridium(III), tris(1-(4'-methylphenyl)isoquinolinato-N,C$^{2'}$)Iridium(III), tris(2-(4',6'-diflourophenyl)-pyridinto-N,C$^{2'}$)Iridium(III), tris(2-((5'-phenyl)-phenyl) pyridinato-N,C$^{2'}$)Iridium(III), tris(2-(2'-benzothienyl) pyridinato-N,C$^{3'}$)Iridium(III), tris(2-phenyl-3,3'dimethyl) indolato-N,C$^{3'}$)Ir(III), tris(1-phenyl-1H-indazolato-N,C$^{2'}$)Ir (III).

Of these, tris(1-phenylisoquinoline) iridium (III) (also referred to as Ir(piq)$_3$) and tris(2-phenylpyridine) iridium (also referred to as Ir(ppy)$_3$) are particularly suitable for this invention.

Tris-C,N-cyclometallated phosphorescent materials also include compounds according to Formula (J) wherein the monoanionic bidentate ligand X—Y is another C,N-cyclometallating ligand. Examples include bis(1-phenylisoquinolinato-N,C$^{2'}$)(2-phenylpyridinato-N,C$^{2'}$)Iridium(III) and bis (2-phenylpyridinato-N,C$^{2'}$) (1-phenylisoquinolinato-N,C$^{2'}$) Iridium(III). Synthesis of such tris-C,N-cyclometallated complexes containing two different C,N-cyclometallating ligands can be conveniently synthesized by the following steps. First, a bis-C,N-cyclometallated diiridium dihalide complex (or analogous dirhodium complex) is made according to the method of Nonoyama (*Bull. Chem. Soc. Jpn.*, 47, 767 (1974)). Secondly, a zinc complex of the second, dissimilar C,N-cyclometallating ligand is prepared by reaction of a zinc halide with a lithium complex or Grignard reagent of the cyclometallating ligand. Third, the thus formed zinc complex of the second C,N-cyclometallating ligand is reacted with the previously obtained bis-C,N-cyclometallated diiridium dihalide complex to form a tris-C,N-cyclometallated complex containing the two different C,N-cyclometallating ligands. Desirably, the thus obtained tris-C,N-cyclometallated complex containing the two different C,N-cyclometallating ligands can be converted to an isomer wherein the C atoms bonded to the metal (e.g. Ir) are all mutually cis by heating in a suitable solvent such as dimethyl sulfoxide.

Suitable phosphorescent materials according to Formula (J) can in addition to the C,N-cyclometallating ligand(s) also contain monoanionic bidentate ligand(s) X—Y that are not C,N-cyclometallating. Common examples are beta-diketonates such as acetylacetonate, and Schiff bases such as picolinate. Examples of such mixed ligand complexes according to Formula (J) include bis(2-phenylpyridinato-N,C$^{2'}$)Iridium (III)(acetylacetonate), bis(2-(2'-benzothienyl)pyridinato-N, C$^{3'}$)Iridium(III)(acetylacetonate), and bis(2-(4',6'-diflourophenyl)-pyridinato-N,C$^{2'}$)Iridium(III)(picolinate).

Other important phosphorescent materials according to Formula (J) include C,N-cyclometallated Pt(II) complexes such as cis-bis(2-phenylpyridinato-N,C$^{2'}$)platinum(II), cis-bis(2-(2'-thienyl)pyridinato-N,C$^{3'}$)platinum(II), cis-bis(2-(2'-thienyl)quinolinato-N,C$^{5'}$) platinum(II), or (2-(4',6'-diflourophenyl)pyridinato-N,C$^{2'}$) platinum (II) (acetylacetonate).

The emission wavelengths (color) of C,N-cyclometallated phosphorescent materials according to Formula (J) are governed principally by the lowest energy optical transition of the complex and hence by the choice of the C,N-cyclometallating ligand. For example, 2-phenyl-pyridinato-N,C$^{2'}$ complexes are typically green emissive while 1-phenyl-isoquinolinato-N,C$^{2'}$ complexes are typically red emissive. In the case of complexes having more than one C,N-cyclometallating ligand, the emission will be that of the ligand having the property of longest wavelength emission. Emission wavelengths can be further shifted by the effects of substituent groups on the C,N-cyclometallating ligands. For example, substitution of electron donating groups at appropriate positions on the N-containing ring A or electron accepting groups on the C-containing ring B tend to blue-shift the emission relative to the unsubstituted C,N-cyclometallated ligand complex. Selecting a monodentate anionic ligand X,Y in Formula (J) having more electron accepting properties also tends to blue-shift the emission of a C,N-cyclometallated ligand complex. Examples of complexes having both monoanionic bidentate ligands possessing electron accepting properties and electron accepting substituent groups on the C-containing ring B include bis(2-(4',6'-difluorophenyl)-pyridinato-N,C$^{2'}$)iridium(III)(picolinate) and bis(2-(4',6'-diflourophenyl)-pyridinato-N,C$^{2'}$)iridium(III)(tetrakis(1-pyrazolyl)borate).

The central metal atom in phosphorescent materials according to Formula (J) can be Rh or Ir (m+n=3) and Pd or Pt (m+n=2). Preferred metal atoms are Ir and Pt since they tend to give higher phosphorescent quantum efficiencies according to the stronger spin-orbit coupling interactions generally obtained with elements in the third transition series.

In addition to bidentate C,N-cyclometallating complexes represented by Formula (J), many suitable phosphorescent materials contain multidentate C,N-cyclometallating ligands. Phosphorescent materials having tridentate ligands suitable for use in the present invention are disclosed in U.S. Pat. No. 6,824,895 131 and references therein. Phosphorescent materials having tetradentate ligands suitable for use in the present invention are described by the following formulae:

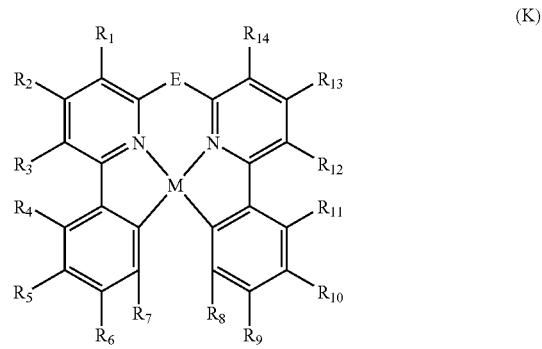

(K)

-continued

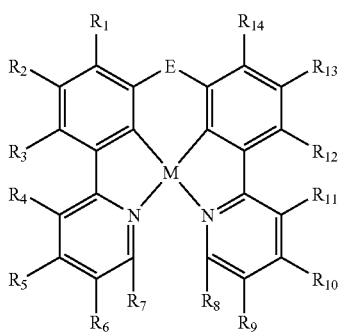
(L)

wherein:

M is Pt or Pd;

R$^1$-R$^7$ represent hydrogen or independently selected substituents, provided that R$^1$ and R$^2$, R$^2$ and R$^3$, R$^3$ and R$^4$, R$^4$ and R$^5$, R$^5$ and R$^6$, as well as R$^6$ and R$^7$ can join to form a ring group;

R$^8$-R$^{14}$ represent hydrogen or independently selected substituents, provided that R$^8$ and R$^9$, R$^9$ and R$^{10}$, R$^{10}$ and R$^{11}$, R$^{11}$ and R$^{12}$, R$^{12}$ and R$^{13}$, as well as R$^{13}$ and R$^{14}$, can join to form a ring group;

E represents a bridging group selected from the following:

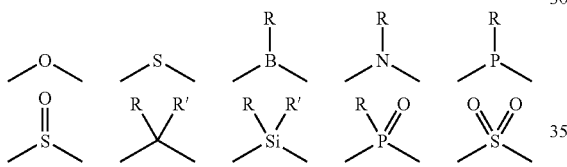

wherein:

R and R' represent hydrogen or independently selected substituents; provided R and R' can combine to form a ring group.

One desirable tetradentate C,N-cyclometallated phosphorescent material suitable for use in as the phosphorescent dopant is represented by the following formula:

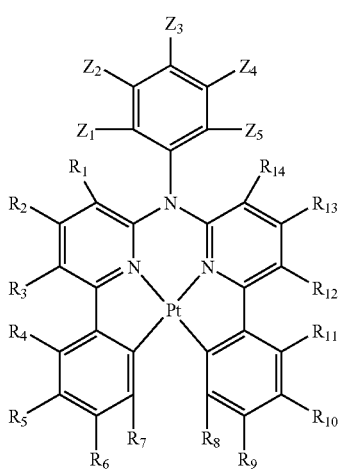
(M)

wherein:

R$^1$-R$^7$ represent hydrogen or independently selected substituents, provided that R$^1$ and R$^2$, R$^2$ and R$^3$, R$^3$ and R$^4$, R$^4$ and R$^5$, R$^5$ and R$^6$, as well as R$^6$ and R$^7$ can combine to form a ring group;

R$^8$-R$^{14}$ represent hydrogen or independently selected substituents, provided that R$^8$ and R$^9$, R$^9$ and R$^{10}$, R$^{10}$ and R$^{11}$, R$^{11}$ and R$^2$, R$^{12}$ and R$^{13}$, as well as R$^{13}$ and R$^{14}$ can combine to form a ring group;

Z$^1$-Z$^5$ represent hydrogen or independently selected substituents, provided that Z$^1$ and Z$^2$, Z$^2$ and Z$^3$, Z$^3$ and Z$^4$, as well as Z$^4$ and Z$^5$ can combine to form a ring group.

Specific examples of phosphorescent materials having tetradentate C,N-cyclometallating ligands suitable for use in the present invention include compounds (M-1), (M-2) and (M-3) represented below.

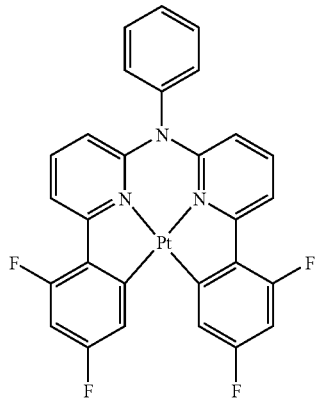
(M-1)

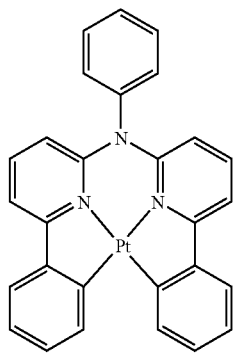
(M-2)

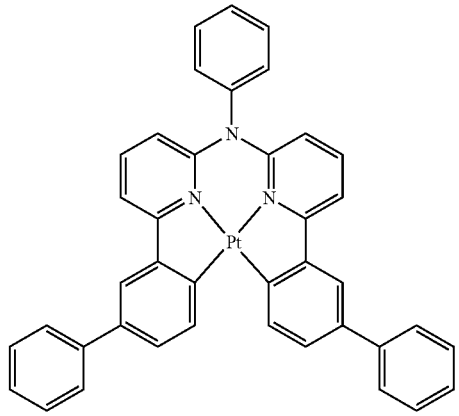
(M-3)

Phosphorescent materials having tetradentate C,N-cyclometallating ligands can be synthesized by reacting the tetradentate C,N-cyclometallating ligand with a salt of the desired metal, such as K$_2$PtCl$_4$, in a proper organic solvent such as glacial acetic acid to form the phosphorescent material having tetradentate C,N-cyclometallating ligands. A tetraalkylammonium salt such as tetrabutylammonium chloride can be used as a phase transfer catalyst to accelerate the reaction.

Other phosphorescent materials that do not involve C,N-cyclometallating ligands are known. Phosphorescent complexes of Pt(II), Ir(I), and Rh(I) with maleonitriledithiolate have been reported (Johnson et al., *J. Am. Chem. Soc.*, 105, 1795 (1983)). Re(I) tricarbonyl diimine complexes are also known to be highly phosphorescent (Wrighton and Morse, J. Am. Chem. Soc., 96, 998 (1974); Stufkens, Comments Inorg. Chem., 13, 359 (1992); Yam, Chem. Commun., 789 (2001)). Os(II) complexes containing a combination of ligands including cyano ligands and bipyridyl or phenanthroline ligands have also been demonstrated in a polymer OLED (Ma et al., Synthetic Metals, 94, 245 (1998)).

Porphyrin complexes such as 2,3,7,8,12,13,17,18-octaethyl-21H, 23H-porphine platinum(II) are also useful phosphorescent dopant.

Still other examples of useful phosphorescent materials include coordination complexes of the trivalent lanthanides such as Tb$^{3+}$ and Eu$^{3+}$ (Kido et al., Chem. Lett., 657 (1990); J. Alloys and Compounds, 192, 30 (1993); Jpn. J. Appl. Phys., 35, L394 (1996) and Appl. Phys. Lett., 65,2124 (1994)).

The phosphorescent dopant in a phosphorescent LEL is typically present in an amount of from 1 to 20% by volume of the LEL, and conveniently from 2 to 8% by volume of the LEL. In some embodiments, the phosphorescent dopant(s) can be attached to one or more host materials. The host materials can further be polymers. The phosphorescent dopant in the first phosphorescent light-emitting layer is selected from green and red phosphorescent materials.

The thickness of a phosphorescent LEL is greater than 0.5 nm, preferably, in the range of from 1.0 nm to 40 nm.

(b) Fluorescent Light Emitting Layers

Although the term "fluorescent" is commonly used to describe any light-emitting material, in this case it refers to a material that emits light from a singlet excited state. Fluorescent materials can be used in the same layer as the phosphorescent material, in adjacent layers, in adjacent pixels, or any combination. Care must be taken not to select materials that will adversely affect the performance of the phosphorescent materials of this invention. One skilled in the art will understand that concentrations and triplet energies of materials in the same layer as the phosphorescent material or in an adjacent layer must be appropriately set so as to prevent unwanted quenching of the phosphorescence.

Typically, a fluorescent LEL includes at least one host and at least one fluorescent dopant. The host can be a hole-transporting material or any of the suitable hosts for phosphorescent dopants as defined above or can be an electron-transporting material as defined below.

The dopant is typically chosen from highly fluorescent dyes, e.g., transition metal complexes as described in WO 98/55561 A1, WO 00/18851 A1, WO 00/57676 A1, and WO 00/70655.

Useful fluorescent dopants include, but are not limited to, derivatives of anthracene, tetracene, xanthene, perylene, phenylene, dicyanomethylenepyran compounds, thiopyran compounds, polymethine compounds, pyrylium and thiapyrylium compounds, arylpyrene compounds, arylenevinylene compounds, periflanthene derivatives, indenoperylene derivatives, bis(azinyl)a-mine boron compounds, bis(azinyl)methane boron compounds, distryrylbenzene derivatives, distyrylbiphenyl derivatives, distyrylamine derivatives and carbostyryl compounds.

Some fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrylium compounds, fluorene derivatives, periflanthene derivatives, indenoperylene derivatives, bis(azinyl)amine boron compounds, bis(azinyl)methane compounds (as described in U.S. Pat. No. 5,121,029) and carbostyryl compounds. Illustrative examples of useful materials include, but are not limited to, the following:

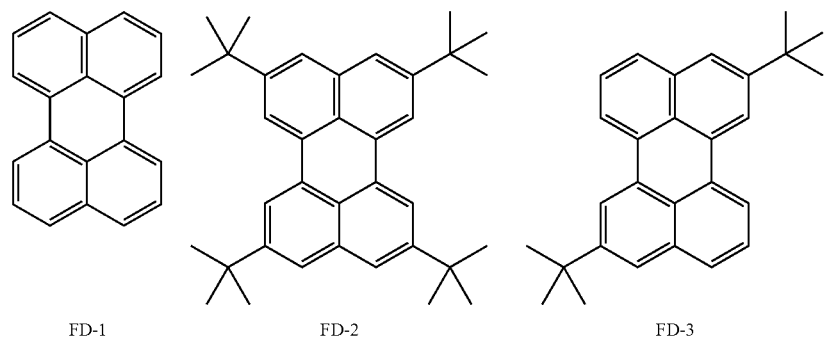

FD-1    FD-2    FD-3

-continued
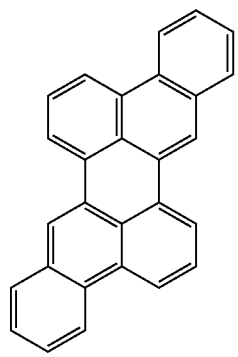
FD-4
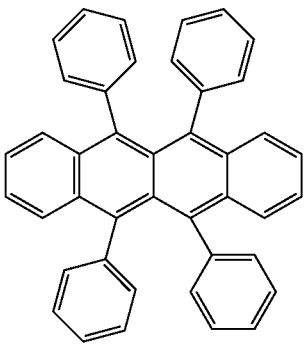
FD-5
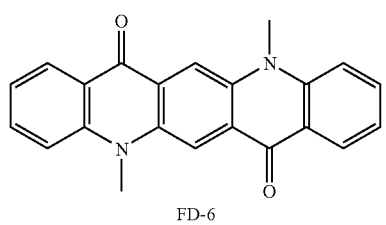
FD-6
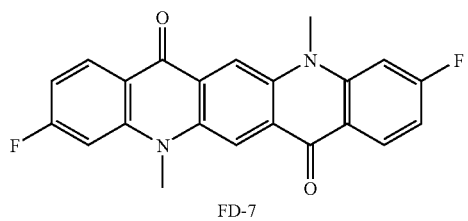
FD-7
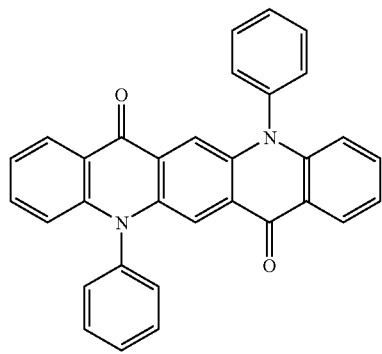
FD-8
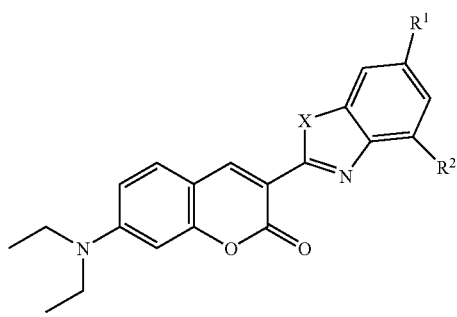
|       | X | R1     | R2     |
|-------|---|--------|--------|
| FD-9  | O | H      | H      |
| FD-10 | O | H      | Methyl |
| FD-11 | O | Methyl | H      |

-continued

| | | | |
|---|---|---|---|
| FD-12 | O | Methyl | Methyl |
| FD-13 | O | H | t-butyl |
| FD-14 | O | t-butyl | H |
| ED-15 | O | t-butyl | t-butyl |
| FD-16 | S | H | H |
| ED-17 | S | H | Methyl |
| FD-18 | S | Methyl | H |
| FD-19 | S | Methyl | Methyl |
| FD-20 | S | H | t-butyl |
| FD-21 | S | t-butyl | H |
| FD-22 | S | t-butyl | t-butyl |

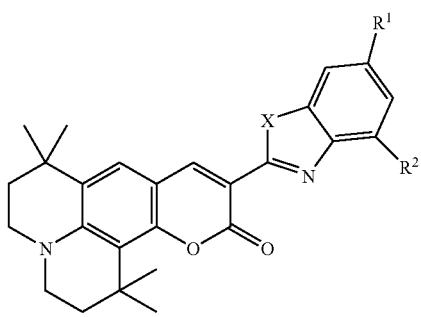

| | X | R1 | R2 |
|---|---|---|---|
| FD-13 | O | H | H |
| FD-24 | O | H | Methyl |
| FD-25 | O | Methyl | H |
| FD-26 | O | Methyl | Methyl |
| FD-27 | O | H | t-butyl |
| FD-28 | O | t-butyl | H |
| FD-29 | O | t-butyl | t-butyl |
| FD-30 | S | H | H |
| FD-31 | S | H | Methyl |
| FD-32 | S | Methyl | H |
| FD-33 | S | Methyl | Methyl |
| FD-34 | S | H | t-butyl |
| FD-35 | S | t-butyl | H |
| FD-36 | S | t-butyl | t-butyl |

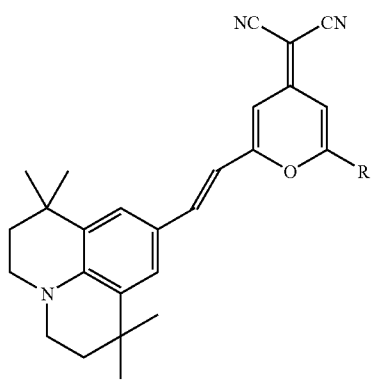

| | R |
|---|---|
| FD-37 | phenyl |
| FD-38 | methyl |
| FD-39 | t-butyl |
| FD-40 | mesityl |

-continued
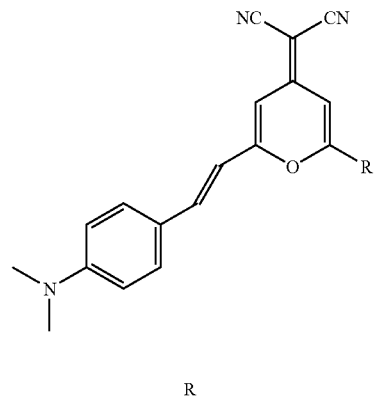
R
| | |
|---|---|
| FD-41 | phenyl |
| FD-42 | methyl |
| FD-43 | t-butyl |
| FD-44 | mesityl |
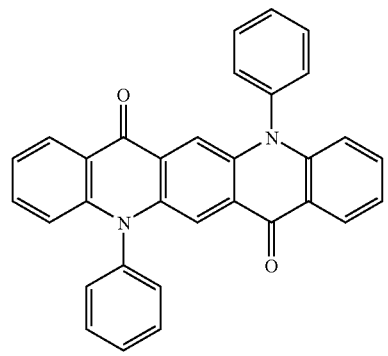
FD-45
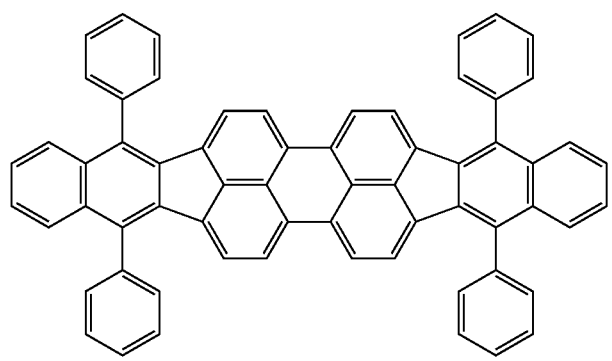
FD-46

-continued
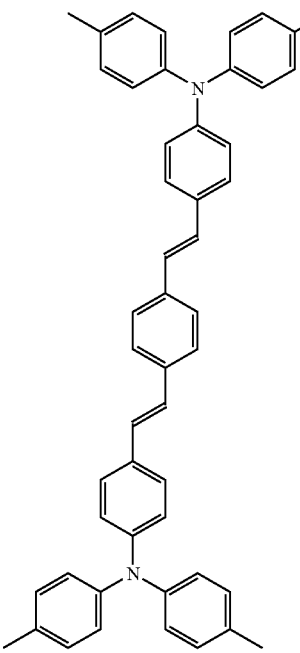
FD-47
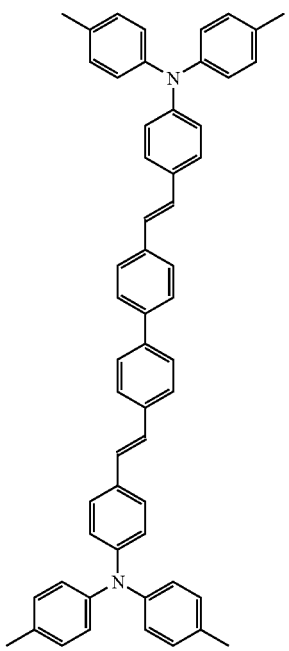
FD-48
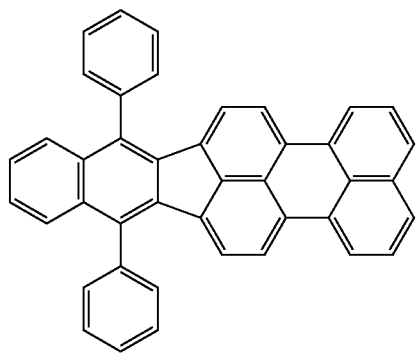
FD-49
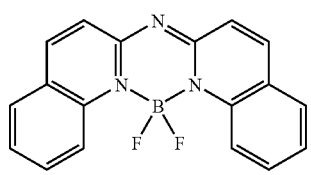
FD-50
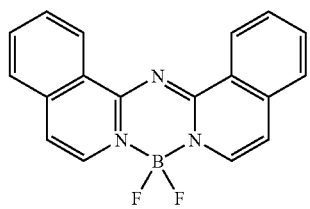
FD-51
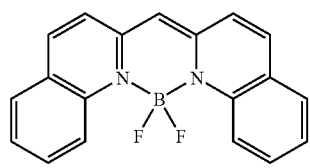
FD-52

-continued
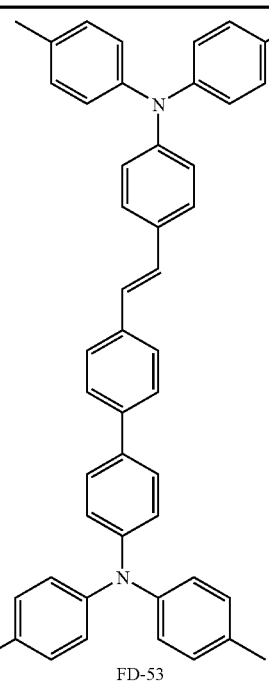
FD-53   FD-54
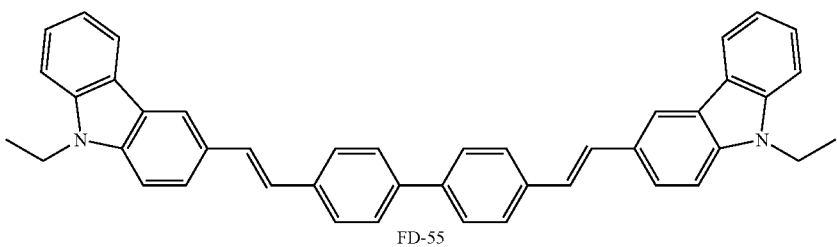
FD-55
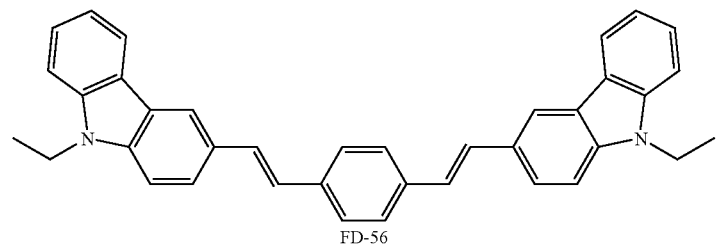
FD-56
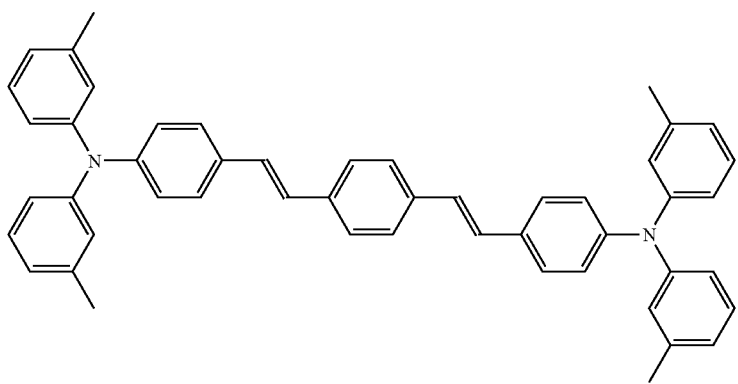
FD-57
Preferred fluorescent blue dopants can be found in Chen, Shi, and Tang, "Recent Developments in Molecular Organic Electroluminescent Materials," *Macromol Symp.* 125, 1 (1997) and the references cited therein; Hung and Chen, "Recent Progress of Molecular Organic Electroluminescent Materials and Devices," *Mat. Sci. and Eng. R*39, 143 (2002) and the references cited therein.

A particularly preferred class of blue-emitting fluorescent dopants is represented by Formula (N), known as a bis(azinyl0amine borane complex, and is described in U.S. Pat. No. 6,661,023.

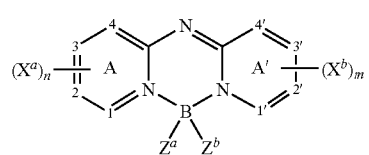

Formula (N)

wherein:
A and A' represent independent azine ring systems corresponding to 6-membered aromatic ring systems containing at least one nitrogen;

each $X^a$ and $X^b$ is an independently selected substituent, two of which can join to form a fused ring to A or A';

m and n are independently 0 to 4;

$Z^a$ and $Z^b$ are independently selected substituents; and 1, 2, 3, 4, 1', 2', 3', and 4' are independently selected as either carbon or nitrogen atoms.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring. Desirably, $Z^a$ and $Z^b$ are fluorine atoms.

Preferred embodiments further include devices where the two fused ring systems are quinoline or isoquinoline systems; the aryl or heterocyclic substituent is a phenyl group; there are present at least two $X^a$ groups and two $X^b$ groups which join to form a 6-6 fused ring, the fused ring systems are fused at the 1-2, 3-4, 1'-2', or 3,4' positions, respectively; one or both of the fused rings is substituted by a phenyl group; and where the dopant is depicted in Formulae (N-a), (N-b), or (N-c).

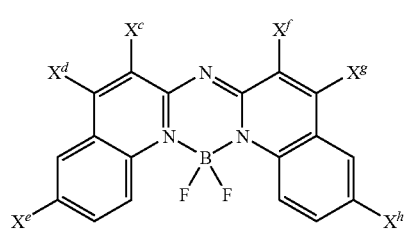

Formula (N-a)

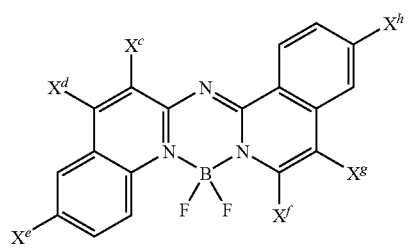

Formula (N-b)

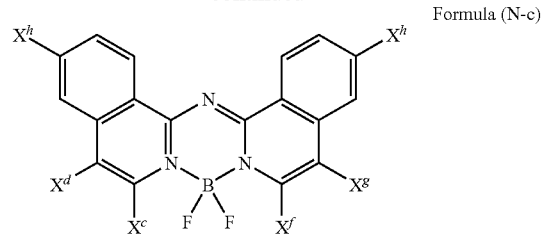

Formula (N-c)

wherein:
each $X^c$, $X^d$, $X^e$, $X^f$, $X^g$, and $X^h$ is hydrogen or an independently selected substituent, one of which must be an aryl or heterocyclic group.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring, and one is an aryl or substituted aryl group. Desirably, $Z^a$ and $Z^b$ are fluorine atoms.

Of these, compound FD-54 is particularly useful.

Coumarins represent a useful class of green-emitting dopants as described by Tang et al. in U.S. Pat. Nos. 4,769,292 and 6,020,078. Green dopants or light-emitting materials can be coated as 0.01 to 50% by weight into the host material, but typically coated as 0.01 to 30% and more typically coated as 0.01 to 15% by weight into the host material. Examples of usefull green-emitting coumarins include C545T and C545TB. Quinacridones represent another useful class of green-emitting dopants. Useful quinacridones are described in U.S. Pat. No. 5,593,788, JP 09-13026A, and commonly assigned U.S. patent application Ser. No. 10/184,356 filed Jun. 27, 2002 by Lelia Cosimbescu, entitled "Device Containing Green Organic Light-Emitting Diode".

Examples of particularly useful green-emitting quinacridones are FD-7 and FD-8.

Formula (N-d) below represents another class of green-emitting dopants useful in the invention.

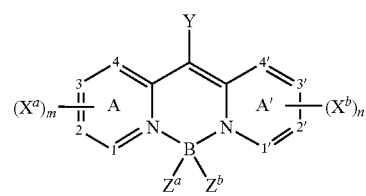

Formula (N-d)

wherein:
A and A' represent independent azine ring systems corresponding to 6-membered aromatic ring systems containing at least one nitrogen;

each $X^a$ and $X^b$ is an independently selected substituent, two of which can join to form a fused ring to A or A';

m and n are independently 0 to 4;

Y is H or a substituent;

$Z^a$ and $Z^b$ are independently selected substituents; and 1, 2, 3, 4, 1', 2', 3', and 4' are independently selected as either carbon or nitrogen atoms.

In the device, 1, 2, 3, 4, 1', 2', 3', and 4' are conveniently all carbon atoms. The device can desirably contain at least one or both of ring A or A' that contains substituents joined to form a fused ring. In one useful embodiment, there is present at least one $X^a$ or $X^b$ group selected from the group including halide and alkyl, aryl, alkoxy, and aryloxy groups. In another embodiment, there is present a $Z^a$ and $Z^b$ group independently selected from the group including fluorine and alkyl, aryl, alkoxy and aryloxy groups. A desirable embodiment is where $Z^a$ and $Z^b$ are F. Y is suitably hydrogen or a substituent such as an alkyl, aryl, or heterocyclic group.

The emission wavelength of these compounds can be adjusted to some extent by appropriate substitution around the central bis(azinyl)methene boron group to meet a color aim, namely green. Some examples of useful material are FD-50, FD-51 and FD-52.

Naphthacenes and derivatives thereof also represent a useful class of emitting dopants, which can also be used as stabilizers. These dopant materials can be coated as 0.01 to 50% by weight into the host material, but typically coated as 0.01 to 30% and more typically coated as 0.01 to 15% by weight into the host material. Naphthacene derivative YD-1 (t-BuDPN) below, is an example of a dopant material used as a stabilizer.

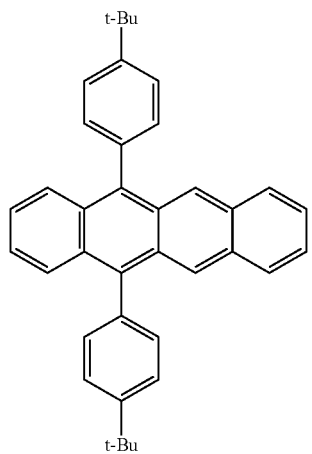

YD-1

Some examples of this class of materials are also suitable as host materials as well as dopants. For example, see U.S. Pat. Nos. 6,773,832 or 6,720,092. A specific example of this would be rubrene (FD-5).

Another class of useful dopants are perylene derivatives; for example see U.S. Pat. No. 6,689,493. A specific examples is FD-46.

Metal complexes of 8-hydroxyquinoline and similar derivatives (Formula O) constitute one class of useful non-electroluminescent host compounds capable of supporting electroluminescence, and are particularly suitable for light emission of wavelengths longer than 500 nm, e.g., green, yellow, orange, and red.

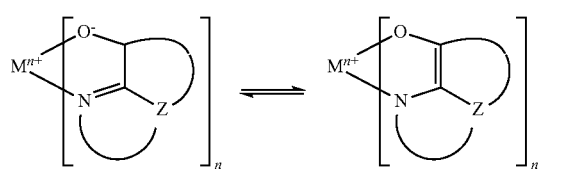

(O)

wherein:
M represents a metal;
n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such as aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

O-1: Aluminum trisoxine [alias, tris(8-quinolinolato)aluminum(III)]
O-2: Magnesium bisoxine [alias, bis(8-quinolinolato)magnesium(II)]
O-3: Bis[benzo{f}-8-quinolinolato]zinc (II)
O-4: Bis(2-methyl-8-quinolinolato)aluminum(III)-μ-oxo-bis(2-methyl-8-quinolinolato)aluminum(III)
O-5: Indium trisoxine [alias, tris(8-quinolinolato)indium]
O-6: Aluminum tris(5-methyloxine)[alias, tris(5-methyl-8-quinolinolato) aluminum(III)]
O-7: Lithium oxine [alias, (8-quinolinolato)lithium(I)]
O-8: Gallium oxine [alias, tris(8-quinolinolato)gallium (III)]
O-9: Zirconium oxine [alias, tetra(8-quinolinolato)zirconium(IV)]
O-10: Bis(2-methyl-8-quinolinato)-4-phenylphenolatoaluminum (III)

Suitable anthracene host materials have been described previously. If more than one light-emitting layer is present, then anthracene derivatives according to Formula (P) can be useful host materials in the additional LEL.

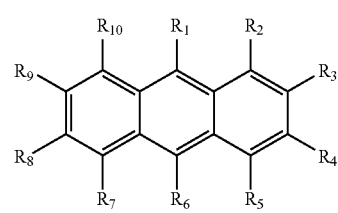

(P)

wherein:
$R_1$-$R_{10}$ are independently chosen from hydrogen, alkyl groups containing from 1 to 24 carbon atoms or aromatic groups containing from 6 to 24 carbon atoms. Particularly preferred are compounds where $R_1$ and $R_6$ are phenyl, biphenyl or napthyl, $R_3$ is phenyl, substituted phenyl or napthyl and $R_2$, $R_4$, $R_5$, $R_7$-$R_{10}$ are all hydrogen. Such anthracene hosts are known to have excellent electron transporting properties.

Particularly desirable are derivatives of 9,10-di-(2-naphthyl)anthracene. Illustrative examples include 9,10-di-(2-naphthyl)anthracene (ADN) and 2-t-butyl-9,10-di-(2-naphthyl)anthracene (TBADN). Other anthracene derivatives can be useful as an non-electroluminescent compound in the LEL, such as diphenylanthracene and its derivatives, as described in U.S. Pat. No. 5,927,247. Styrylarylene derivatives as described in U.S. Pat. No. 5,121,029 and JP 08333569 are also useful non-electroluminescent materials. For example, 9,10-bis[4-(2,2-diphenylethenyl)phenyl]anthracene, 4,4'-Bis(2,2-diphenylethenyl)-1,1'-biphenyl (DPVBi) and phenylanthracene derivatives as described in EP 681,019 are useful non-electroluminescent materials.

Some illustrative examples of suitable anthracenes are:

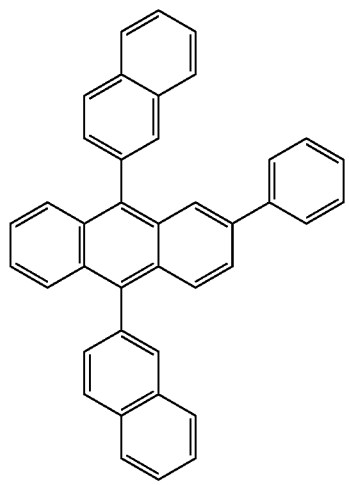
(P-1)

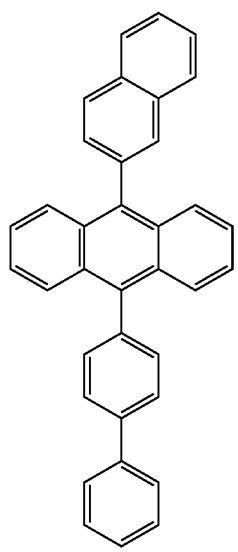
(P-2)

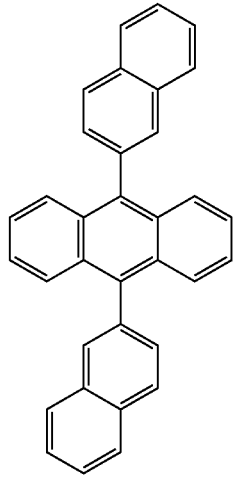
(P-3)

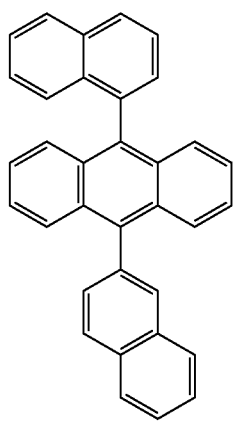
(P-4)

Spacer Layer

Spacer layers, when present, are located in direct contact to a LEL. They can be located on either the anode or cathode, or even both sides of the LEL. They typically do not contain any light-emissive dopants. One or more materials can be used and could be either a hole-transporting material as defined above or an electron-transporting material as defined below. If located next to a phosphorescent LEL, the material in the spacer layer should have higher triplet energy than that of the phosphorescent dopant in the LEL. Most desirably, the material in the spacer layer will be the same as used as the host in the adjacent LEL. Thus, any of the host materials described as also suitable for use in a spacer layer. The spacer layer should be thin; at least 0.1 nm, but preferably in the range of from 1.0 nm to 20 un.

Hole-Blocking Layer (HBL)

When a LEL containing a phosphorescent emitter is present, it is desirable to locate a hole-blocking layer 135 between the electron-transporting layer 136 and the light-emitting layer 134 to help confine the excitons and recombination events to the LEL. In this case, there should be an energy barrier for hole migration from co-hosts into the hole-blocking layer, while electrons should pass readily from the hole-blocking layer into the light-emitting layer including co-host materials and a phosphorescent emitter. It is further desirable that the triplet energy of the hole-blocking material be greater than that of the phosphorescent material. Suitable hole-blocking materials are described in WO 00/70655A2, WO 01/41512 and WO 01/93642A1. Two examples of useful hole-blocking materials are bathocuproine (BCP) and bis(2-methyl-8-quinolinolato)(4-phenylphenolato)aluminum(III) (BAlq). Metal complexes other than BAlq are also known to block holes and excitons as described in U.S. Patent Application Publication No. 2003/0068528. When a hole-blocking layer is used, its thickness can be between 2 and 100 nm and suitably between 5 and 10 nm.

Electron Transporting Layer

Desirable electron-transporting materials have been described previously. Other materials known to be suitable for use in the ETL include, but are not limited to, chelated oxinoid compounds, anthracene derivatives, pyridine-based materials, imidazoles, oxazoles, thiazoles and their derivatives, polybenzobisazoles, cyano-containing polymers and perfluorinated materials.

Other electron-transporting materials include various butadiene derivatives as disclosed in U.S. Pat. No. 4,356,429 and various heterocyclic optical brighteners as described in U.S. Pat. No. 4,539,507.

A preferred class of benzazoles is described by Shi et al. in U.S. Pat. Nos. 5,645,948 and 5,766,779. Such compounds are represented by structural Formula (Q):

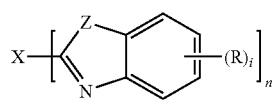

(Q)

In Formula (Q), n is selected from 2 to 8 and i is selected from 1-5;

Z is independently O, NR or S;

R is individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring; and X is a linkage unit consisting of carbon, alkyl, aryl, substituted alkyl, or substituted aryl, which conjugately or unconjugately connects the multiple benzazoles together.

An example of a useful benzazole is 2,2',2''-(1,3,5-phenylene)tris[1-phenyl-1H-benzimidazole] (TPBI) represented by a Formula (Q-1) shown below:

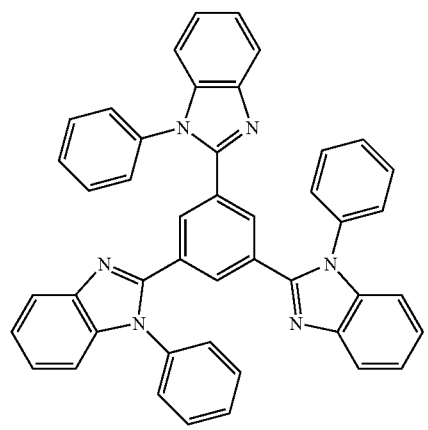

(Q-1)

Another suitable class of the electron-transporting materials includes various substituted phenanthrolines as represented by Formula (R).

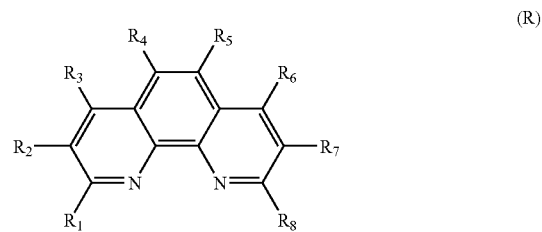

(R)

In Formula (R), $R_1$-$R_8$ are independently hydrogen, alkyl group, aryl or substituted aryl group, and at least one of $R_1$-$R_8$ is aryl group or substituted aryl group.

Specific examples of the phenanthrolines useful in the EIL are 2,9-dimethyl-4,7-diphenyl-phenanthroline (BCP) (see Formula (R-1)) and 4,7-diphenyl-1,10-phenanthroline (Bphen) (see Formula (R-2)).

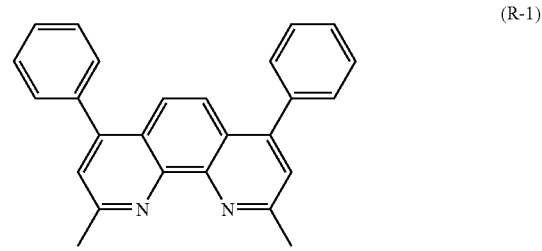

(R-1)

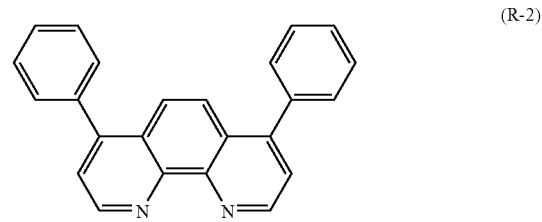

(R-2)

Suitable triarylboranes that function as an electron-transporting material can be selected from compounds having the chemical Formula (S):

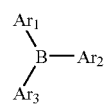

(S)

wherein:

$Ar_1$ to $Ar_3$ are independently an aromatic hydrocarbocyclic group or an aromatic heterocyclic group which can have a substituent. It is preferable that compounds having the above structure are selected from Formula (S-1):

(S-1)

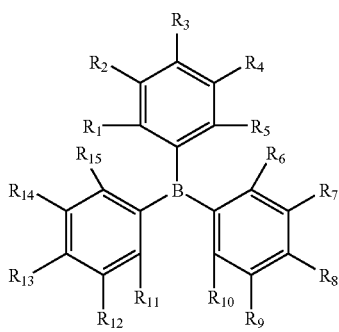

wherein:
$R_1$-$R_{15}$ are independently hydrogen, fluoro, cyano, trifluoromethyl, sulfonyl, alkyl, aryl or substituted aryl group.

Specific representative embodiments of the triarylboranes include:

(S-1)

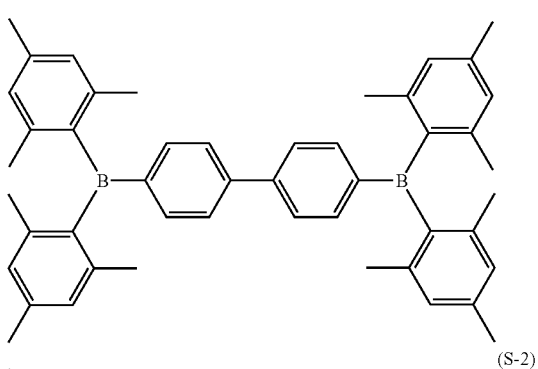

(S-2)

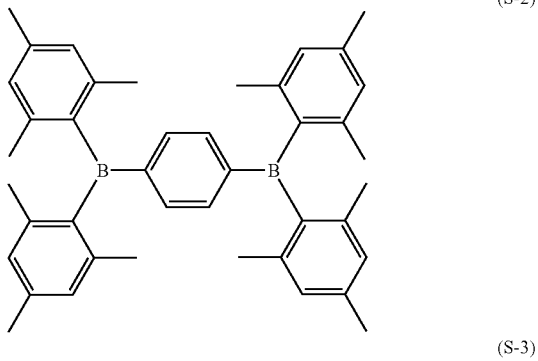

(S-3)

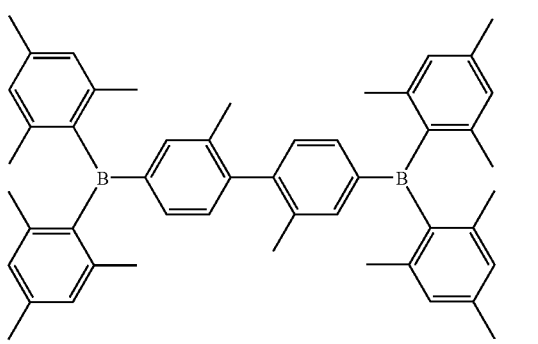

The electron-transporting material can also be selected from substituted 1,3,4-oxadiazoles of Formula (T):

(T)

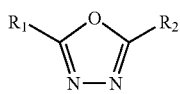

wherein:
$R_1$ and $R_2$ are individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring.

Illustrative of the useful substituted oxadiazoles are the following:

(T-1)

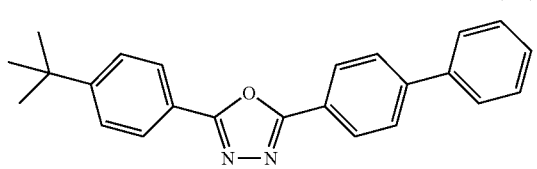

(T-2)

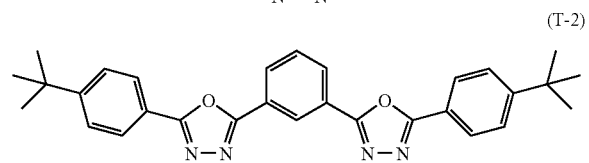

The electron-transporting material can also be selected from substituted 1,2,4-triazoles according to Formula (U):

(U)

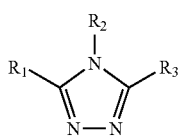

wherein:
$R_1$, $R_2$ and $R_3$ are independently hydrogen, alkyl group, aryl or substituted aryl group, and at least one of $R_1$-$R_3$ is aryl group or substituted aryl group. An example of a useful triazole is 3-phenyl4-(1-naphtyl)-5-phenyl-1,2,4-triazole represented by Formula (U-1):

(U-1)

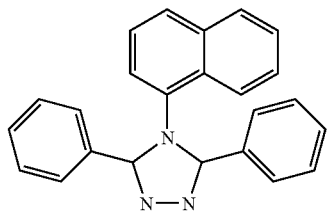

The electron-transporting material can also be selected from substituted 1,3,5-triazines. Examples of suitable materials are:
2,4,6-tris(diphenylamino)-1,3,5-triazine;
2,4,6-tricarbazolo-1,3,5-triazine;

2,4,6-tris(N-phenyl-2-naphthylamino)-1,3,5-triazine;
2,4,6-tris(N-phenyl-1-naphthylamino)-1,3,5-triazine;
4,4',6,6'-tetraphenyl-2,2'-bi-1,3,5-triazine;
2,4,6-tris([1,1':3',1''-terphenyl]-5'-yl)-1,3,5-triazine.

In addition, any of the metal chelated oxinoid compounds including chelates of oxine itself (also commonly referred to as 8-quinolinol or 8-hydroxyquinoline) of Formula (O) useful as host materials in a LEL are also suitable for use in the ETL.

Some metal chelated oxinoid compounds having high triplet energy can be particularly useful as an electron-transporting materials. Particularly useful aluminum or gallium complex host materials with high triplet energy levels are represented by Formula (W).

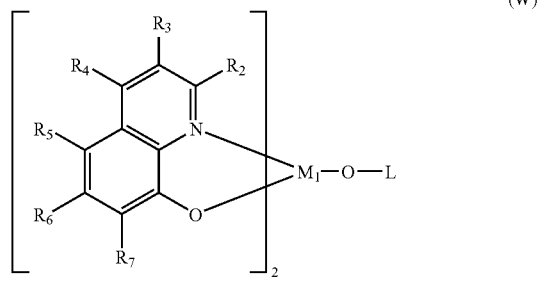

In Formula (W), $M_1$ represents Al or Ga. $R_2$-$R_7$ represent hydrogen or an independently selected substituent. Desirably, $R_2$ represents an electron-donating group. Suitably, $R_3$ and $R_4$ each independently represent hydrogen or an electron donating substituent. A preferred electron-donating group is alkyl such as methyl. Preferably, $R_5$, $R_6$, and $R_7$ each independently represent hydrogen or an electron-accepting group. Adjacent substituents, $R_2$-$R_7$, can combine to form a ring group. L is an aromatic moiety linked to the aluminum by oxygen, which can be substituted with substituent groups such that L has from 6 to 30 carbon atoms.

Illustrative of useful chelated oxinoid compounds for use in the ETL is Aluminum(III) bis(2-methyl-8-hydroxyquinoline)-4-phenylphenolate [alias, Balq].

The same anthracene derivatives according to Formula (P) useful as host materials in the LEL can also be used in the ETL.

The thickness of the ETL is typically in the range of from 5 nm to 200 nm, preferably, in the range of from 10 nm to 150 nm.

Electron Injection Layer

The EIL can be an n-type doped layer containing at least one electron-transporting material as a host and at least one n-type dopant. The dopant is capable of reducing the host by charge transfer. The term "n-type doped layer" indicates that this layer has semiconducting properties after doping, and the electrical current through this layer is substantially carried by the electrons.

The host in the EIL can be an electron-transporting material capable of supporting electron injection and electron transport. The electron-transporting material can be selected from the electron-transporting materials for use in the ETL region as defined above.

The n-type dopant in the n-type doped EIL can be is selected from alkali metals, alkali metal compounds, alkaline earth metals, or alkaline earth metal compounds, or combinations thereof The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Tb, Dy, or Yb, and their compounds, are particularly useful. The materials used as the n-type dopants in the n-type doped EIL also include organic reducing agents with strong electron-donating properties. By "strong electron-donating properties" it is meant that the organic dopant should be able to donate at least some electronic charge to the host to form a charge-transfer complex with the host. Nonlimiting examples of organic molecules include bis(ethylenedithio)-tetrathiafulvalene (BEDT-TTF), tetrathiafulvalene (TTF), and their derivatives. In the case of polymeric hosts, the dopant is any of the above or also a material molecularly dispersed or copolymerized with the host as a minor component. Preferably, the n-type dopant in the n-type doped EIL includes Li, Na, K, Rb, Cs, Mg, Ca, Sr, Ba, La, Ce, Nd, Sm, Eu, Tb, Dy, or Yb, or combinations thereof. The n-type doped concentration is preferably in the range of 0.01-20% by volume of this layer.

In a one embodiment, the electron-injection layer contains a phenanthroline derivative doped with a metal. Suitable metals include Li, Na, K, Rb, Cs, Mg, Ca, Sr, Ba, La, Ce, Sm, Eu, Tb, Dy, or Yb with lithium being the most preferred. Suitable substituted phenanthrolines for this application include those according to Formula (R), as described previously.

The thickness of the ETL is often in the range of from 5 nm to 200 nm, and typically in the range of from 10 nm to 150 nm.

Cathode

When light emission is viewed solely through the anode, the cathode 140 includes nearly any conductive material. Desirable materials have effective film-forming properties to ensure effective contact with the underlying organic layer, promote electron injection at low voltage, and have effective stability. Useful cathode materials often contain a low work function metal (<4.0 eV) or metal alloy. One preferred cathode material includes a Mg:Ag alloy as described in U.S. Pat. No. 4,885,221. Another suitable class of cathode materials includes bilayers including a thin inorganic EIL in contact with an organic layer (e.g., organic EIL or ETL), which is capped with a thicker layer of a conductive metal. Here, the inorganic EIL preferably includes a low work function metal or metal salt and, if so, the thicker capping layer does not need to have a low work function. One such cathode includes a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, cathode 140 should be transparent or nearly transparent. For such applications, metals should be thin or one should use transparent conductive oxides, or include these materials. Optically transparent cathodes have been described in more detail in U.S. Pat. Nos. 4,885,211, 5,247,190, 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, 6,278,236, 6,284,393, and EP 1076 368. Cathode materials are typically deposited by thermal evaporation, electron beam evaporation, ion sputtering, or chemical vapor deposition. When needed, patterning is achieved through many well known methods including, but not limited to, through-mask deposition, integral shadow masking, for example as described in U.S. Pat. No. 5,276,380 and EP 0 732 868, laser ablation, and selective chemical vapor deposition.

The thickness of the EIL is typically less than 20 nm, and preferably in the range of 10 nm or less.

Substrate

OLED 100 is typically provided over a supporting substrate 110 where either the anode 120 or cathode 140 can be in contact with the substrate. The electrode in contact with the substrate is conveniently referred to as the bottom electrode. Conventionally, the bottom electrode is the anode 120, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. The substrate can be a complex structure including multiple layers of materials. This is typically the case for active matrix substrates wherein TFTs are provided below the OLED layers. It is still necessary that the substrate, at least in the emissive pixelated areas, include largely transparent materials such as glass or polymers. For applications where the EL emission is viewed through the top electrode, the transmissive characteristic of the bottom support is immaterial, and therefore the substrate can be light transmissive, light absorbing or light reflective. Substrates for use in this case include, but are not limited to, glass, plastic, semiconductor materials such as silicon, ceramics, and circuit board materials. Again, the substrate can be a complex structure including multiple layers of materials such as found in active matrix TFT designs. It is necessary to provide in these device configurations a light-transparent top electrode.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often includes a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be premixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,851,709 and U.S. Pat. No. 6,066,357) and inkjet method (U.S. Pat. No. 6,066,357).

Organic materials useful in making OLEDs, for example organic hole-transporting materials, organic light-emitting materials doped with an organic electroluminescent components have relatively complex molecular structures with relatively weak molecular bonding forces, so that care must be taken to avoid decomposition of the organic material(s) during physical vapor deposition. The aforementioned organic materials are synthesized to a relatively high degree of purity, and are provided in the form of powders, flakes, or granules. Such powders or flakes have been used heretofore for placement into a physical vapor deposition source wherein heat is applied for forming a vapor by sublimation or vaporization of the organic material, the vapor condensing on a substrate to provide an organic layer thereon.

Several problems have been observed in using organic powders, flakes, or granules in physical vapor deposition: These powders, flakes, or granules are difficult to handle. These organic materials generally have a relatively low physical density and undesirably low thermal conductivity, particularly when placed in a physical vapor deposition source which is disposed in a chamber evacuated to a reduced pressure as low as $10^{-6}$ Torr. Consequently, powder particles, flakes, or granules are heated only by radiative heating from a heated source, and by conductive heating of particles or flakes directly in contact with heated surfaces of the source. Powder particles, flakes, or granules which are not in contact with heated surfaces of the source are not effectively heated by conductive heating due to a relatively low particle-to-particle contact area. This can lead to nonuniform heating of such organic materials in physical vapor deposition sources. Therefore, result in potentially nonuniform vapor-deposited organic layers formed on a substrate.

These organic powders can be consolidated into a solid pellet. These solid pellets consolidating into a solid pellet from a mixture of a sublimable organic material powder are easier to handle. Consolidation of organic powder into a solid pellet can be accomplished with relatively simple tools. A solid pellet formed from mixture including one or more non-luminescent organic non-electroluminescent component materials or luminescent electroluminescent component materials or mixture of non-electroluminescent component and electroluminescent component materials can be placed into a physical vapor deposition source for making organic layer. Such consolidated pellets can be used in a physical vapor deposition apparatus.

In one aspect, the present invention provides a method of making an organic layer from compacted pellets of organic materials on a substrate, which will form part of an OLED.

One preferred method for depositing the materials of the present invention is described in U.S. Patent Application Publication No. 2004/0255857 and U.S. Pat. No. 7,288,286 where different source evaporators are used to evaporate each of the materials of the present invention. A second preferred method involves the use of flash evaporation where materials are metered along a material feed path in which the material feed path is temperature controlled. Such a preferred method is described in the following co-assigned patents and publications: U.S. Pat. Nos. 7,232,588; 7,238,389; 7,288,285; 7,288,286; 7,165,340 and U.S. Patent Application Publication No. 2006/01775. Using this second method, each material can be evaporated using different source evaporators or the solid materials can be mixed prior to evaporation using the s same source evaporator.

Encapsulation

Most OLED devices are sensitive to moisture or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

OLED Device Design Criteria

For full color display, the pixelation of LELs can be needed. This pixelated deposition of LELs is achieved using shadow masks, integral shadow masks, U.S. Pat. No. 5,294,870, spatially defined thermal dye transfer from a donor sheet, U.S. Pat. Nos. 5,688,551, 5,851,709, and 6,066,357, and inkjet method, U.S. Pat. No. 6,066,357.

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings can be specifically provided over the cover or as part of the cover.

Embodiments of the invention can provide EL devices that have good luminance efficiency, good operational stability, and reduced drive voltages. Embodiments of the invention can also give reduced voltage rises over the lifetime of the devices and can be produced with high reproducibility and consistently to provide good light efficiency. Further embodiments can provide a wide range of emitted hues and in particular a short-blue color emission. They can have lower power consumption requirements and, when used with a battery, provide longer battery lifetimes.

The invention and its advantages are further illustrated by the specific examples that follow. The term "percentage" or "percent" and the symbol "%" indicate the volume percent (or a thickness ratio as measured on a thin film thickness monitor) of a particular first or second compound of the total material in the layer of the invention and other components of the devices. If more than one second compound is present, the total volume of the second compounds can also be expressed as a percentage of the total material in the layer of the invention.

REPRESENTATIVE SYNTHETIC EXAMPLE

Preparation of Inv-3

Inv-3 was synthesized as outlined in Scheme 1 and described below.

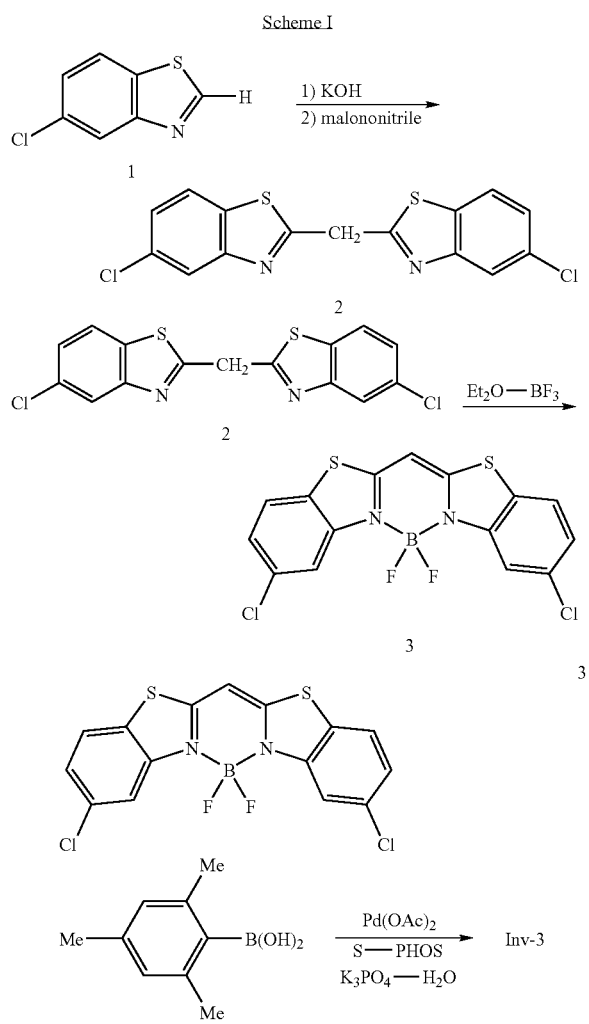

Preparation of Intermediate 2: 2,2'-Methylenebis(5-chlorobenzothiazole)

A 25 mL solution of 80% ethylene glycol was degassed with nitrogen sparging for five minutes. To this was added 7.35 g of 5-chlorobenzothiazole (compound 1). The resultant mixture was degassed for five minutes more and then placed under a positive nitrogen atmosphere. A second 25 mL solution of 80% ethylene glycol was degassed with nitrogen sparging for five minutes. To this second solution was added 11.2 g of potassium hydroxide pellets. The resultant solution was degassed for five minutes more. The potassium hydroxide solution was added to the benzothiazole mixture. While under a positive nitrogen atmosphere, the reaction flask was heated in an oil bath heated to 115° C. The reaction mixture was stirred overnight. In the morning the reaction was neutralized by the addition of 12 g of degassed acetic acid to attain a pH of 5.5-6.0, and then 1.19 g of malononitrile was added followed by 45 mL of degassed ethanol. The thick slurry was heated to 100° C. for three hours, and then cooled to ambient temperature. The solid was collected by filtration, washed with water, methanol, and ligroin. After drying, 6.37 g of product was obtained. Analysis of the $^1$H NMR spectrum indicated that the desired product was obtained. High performance liquid chromatography (HPLC) analysis indicted that the product had only one component.

Preparation of Intermediate 3: Difluoro[F2.2'-methylenebis(5-chlorobenzothiazole), (1-)-N,N']boron To a pressure tube was added 6.3 g of 2,2'-methylenebis(5-chlorobenzothiazole), 11.4 mL of borontrifluoride etherate, and 30 mL of dry acetonitrile. The tube was sealed and placed in an oil bath. A bright yellow solid was observed in the thick mixture. The mixture was stirred with heating, overnight. Analysis by TLC indicated starting material remained. The reaction was diluted with 40 mL of dry acetonitrile and heated in the oil bath for three hours. The resulting mixture was cooled, and then poured into 350 mL of cold water with stirring. Sodium hydroxide solution (10%) was added until the pH reached 8-9. The bright yellow solid was collected by filtration, washed with water, methanol, and then with diisopropyl ether. After drying, 6.86 g of product was obtained. Analysis of the $^1$H NMR spectrum indicated that the desired product was obtained. HPLC analysis indicted that the product had only one component.

Preparation of Inv-3: Difluoro[[2.2'-methylenebis[5-mesitylbenzothiazole]](1-)-N,N']boron Into a nitrogen filled pressure tube with continuous nitrogen sweeping were added sequentially: 0.6 g of difluoro[[2,2'-methylenebis[5-chlorobenzothiazole]](1-)-N,N']boron, 0.74 g of mesitylboronic acid, 5 mL of degassed toluene, 0.0202 g of palladium acetate, 0.074 g of S-PHOS (2-dicyclohexylphosphino-2',6'-dimethoxybiphenyl), and finally 1.72 g of potassium phosphate mono hydrate. The tube was sealed and place in an oil bath under thermostat control heated to 65° C. overnight. The reaction mixture was then filtered through a celite pad on glass fiber paper (GF/F). The celite cake was washed with hot toluene. The filtrate was concentrated by evaporating the solvent and the crude product was then suspended in boiling ethyl acetate. The bright yellow solid was collected by filtration and analyzed by HPLC to be 100% one component. The filtrate was concentrated and the residue was treated with boiling ethyl acetate, as before, to provide a second crop of product. The second crop assayed to 99.5% purity by HPLC. The combined product obtained was 0.64 g. The product was sublimed in a tube sublimator under a dry, nitrogen gas flow at 240-250° C. to give 0.56 g of Inv-3.

Analysis of the $^1$H NMR spectrum and the mass spectrum (MS) indicated that the desired product was obtained. HPLC analysis indicated that the product included only one component.

EXAMPLE 2

Solutions Spectra

Absorption and emission spectra were obtained at room temperature in ethyl acetate solution at concentrations of $10^{-5}$ to $10^{-6}$ M for representative inventive and comparative boron complexes. Table 1 lists the wavelength of maximum absorption ($\lambda$max) and the wavelength of maximum emission (Emax). The quantum efficiency ($\Phi$) is defined as the ratio of emitted photons to absorbed photons and it was also determined for each complex and is reported in Table 1. A fluorescence procedure is well known to those skilled in the art (see, for example, C. A. Parker and W. T. Rees, *Analyst*, 85, 587 (1960)). Comparison boron complexes are listed below.

TABLE 1

Emission Data

C-1

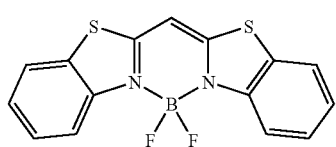

C-2

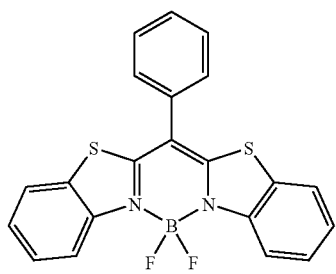

C-3

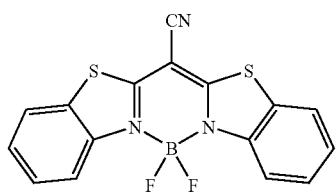

C-4

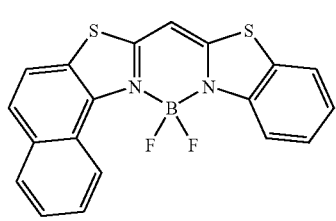

TABLE 1-continued

C-5

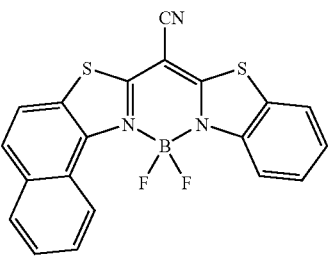

C-6

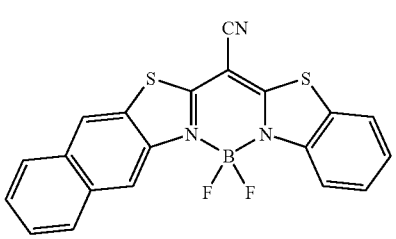

C-7

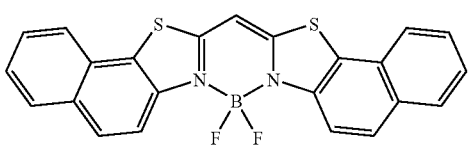

C-8

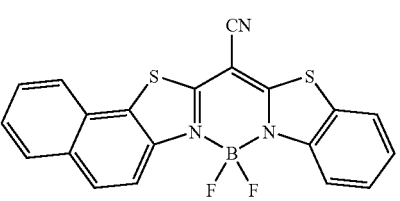

C-9

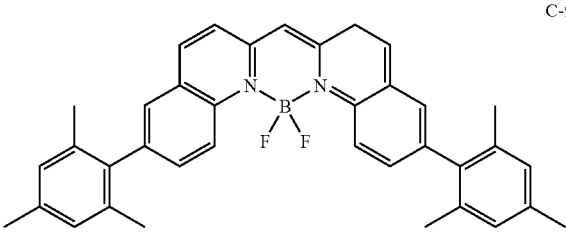

| Compound | $\lambda$max (nm) | Emax | $\Phi$ |
|---|---|---|---|
| C-1 (Comparative) | 418 | 426 | 1.00 |
| C-2 (Comparative) | 426 | 464 | 0.87 |
| C-3 (Comparative) | 402 | 410 | 1.00 |
| C-4 (Comparative) | 432 | 440 | 0.11 |
| C-5 (Comparative) | 416 | 430 | 0.14 |
| C-6 (Comparative) | 412 | 418 | 0.56 |
| C-7 (Comparative) | 444 | 452 | 0.11 |
| C-8 (Comparative) | 416 | 426 | 0.21 |
| C-9 (Comparative) | 438 | 440 | 0.80 |

TABLE 1-continued

| | | | |
|---|---|---|---|
| Inv-1 (Inventive) | 428 | 434 | 0.79 |
| Inv-3 (Inventive) | 424 | 432 | 1.00 |
| Inv-4 (Inventive | 428 | 434 | 1.00 |

From Table 1, one can see that the inventive compounds (Inv-1, Inv-3, and Inv-4) have good quantum efficiencies and emit at a desirable wavelength. In one embodiment, a complex having a solution emission in the range of 425-435 nm is desirable in order to obtain a good short-blue color when the complex is incorporated into an EL device.

It can also be seen from Table I that comparative compounds having an excessive number of fused rings as part of the boron complex nucleus (C-4, C-5, C-6, C-7, and C-8) can provide light emission at a desirable wavelength (e.g., C-5 emits at 430 nm), but have very low quantum efficiencies. In addition, C-2 and C-3, are compounds that do not contain back-ring substitution and, although they have good quantum efficiency, provide an emission that is either too short (C-3) or too deep (C-2) for a desirable short-blue emission.

Compound C-9 is an example of a boron atom bonded to nitrogen atoms of two 6-membered heteroaromatic rings. This compound offers a good quantum yield., but its emission wavelength is too deep (440 nm) to provide a good short-blue color.

C-1 provides both a high solution quantum yield and a suitable Emax, however, as described below in Examples 5 and 6, when incorporated into an EL device this complex does not afford a device that produces a short-blue color with high efficiency.

EXAMPLE 3

Preparation of devices 3.1 through 3.12.

A series of OLED devices (3.1 through 3.12) were constructed in the following manner:
1. A glass substrate coated with a 26-27 nm layer of indium-tin oxide (ITO), as the anode, was sequentially ultrasonicated in a commercial detergent, rinsed in deionized water and exposed to oxygen plasma for about 1 min
2. Over the ITO was deposited a fluorocarbon (CFx) first hole-injecting layer (HIL1) formed by a 10 second, plasma-assisted, deposition of $CHF_3$ as described in U.S. Pat. No. 6,208,075.
3. Over the HIL1 was deposited a second hole-injecting layer (HIL2) corresponding to 10 nm of HIM-1.
4. Next a layer of hole-transporting material 4,4'-Bis[N-(1-naphthyl)-N-phenylamino]biphenyl (NPB) was deposited to a thickness of 85.0 nm.
5. A 20 nm light-emitting layer (LEL) corresponding an anthracene material as identified in Table 2 and a boron complex corresponding to Inv-4 or C-9, as also identified in Table 2, was then deposited. The level of the boron complex is listed in Table 2 as a volume % of the LEL, the remaining volume of the LEL corresponds to the anthracene material.
6. An electron-transporting layer (ETL) corresponding to a mixture of anthracene P-1 and AM-2 (50/50) at a thickness of 31.5 nm was vacuum-deposited over the LEL.
7. An electron-injecting layer (EIL) corresponding to AM-I was vacuum deposited onto the ETL at a thickness of 3.5 nm.
8. And finally, a 100 nm layer of aluminum was deposited onto the EIL, to form the cathode.

The above sequence completes the deposition of the EL device. The device was then hermetically packaged in a dry glove box for protection against ambient environment.

The devices thus formed were tested for efficiency (Eff., W/A) at an operating current of 20 mA/cm$^2$ and the results are reported in Table 2. Device efficiency is the radiant flux (in watts) produced by the device per amp of input current, where radiant flux is the light energy produced by the device per unit time. The color of light produced by each device in $CIE_x$, $CIE_y$ (Commission Internationale de L'Eclairage) coordinates is also listed in Table 2.

TABLE 2

Results for devices 3.1 through 3.12.

HIM-1

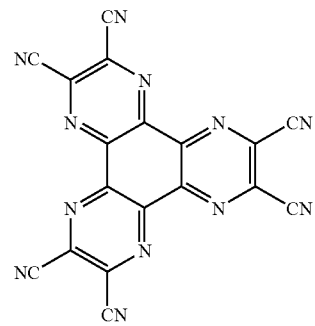

AM-2

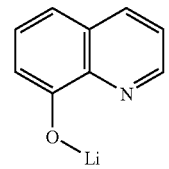

AM-1

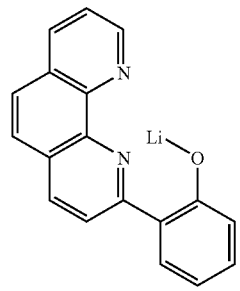

TABLE 2-continued

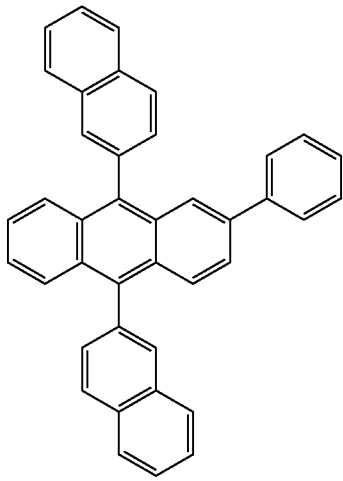

P-1

| Example (Type) | Anthracene | Boron Complex | Level (%) | Eff. (W/A) | $CIE_X$ | $CIE_Y$ |
|---|---|---|---|---|---|---|
| 3.1 (Inventive) | An-4 | Inv-4 | 0.5 | 0.145 | 0.144 | 0.094 |
| 3.2 (Inventive) | An-4 | Inv-4 | 2.0 | 0.157 | 0.143 | 0.095 |
| 3.3 (Inventive) | An-4 | Inv-4 | 1.0 | 0.162 | 0.145 | 0.087 |
| 3.4 (Inventive) | An-2 | Inv-4 | 0.5 | 0.164 | 0.145 | 0.088 |
| 3.5 (Inventive) | An-2 | Inv-4 | 2.0 | 0.163 | 0.144 | 0.090 |
| 3.6 (Inventive) | An-2 | Inv-4 | 1.0 | 0.155 | 0.145 | 0.087 |
| 3.7 (Comparative) | P-1 | Inv-4 | 0.5 | 0.116 | 0.146 | 0.151 |
| 3.8 (Comparative) | P-1 | Inv-4 | 2.0 | 0.123 | 0.144 | 0.144 |
| 3.9 (Comparative) | P-1 | Inv-4 | 1.0 | 0.116 | 0.145 | 0.149 |
| 3.10 (Comparative) | An-4 | C-9 | 0.5 | 0.171 | 0.140 | 0.120 |
| 3.11 (Comparative) | An-4 | C-9 | 2.0 | 0.105 | 0.142 | 0.133 |
| 3.12 (Comparative) | An-4 | C-9 | 1.0 | 0.154 | 0.139 | 0.123 |

As can be seen from Table 2, devices 3.1 through 3.6 containing the combination of boron complex Inv-4 and a 9,10-diarylanthracene (An-2 or An-4) afford, in addition to high luminance and low voltage, a short-blue color corresponding to a $CIE_y$ coordinate less than 0.10. When Inv-4 is used in combination with anthracene P-1, having an aromatic substituent in the 2-position, the light produced has an $CIE_y$ coordinate that is shifted to about 0.15 and one does not obtain a short-blue emission (devices 3.7-3.9). Likewise, when the comparative boron complex C-9 is combined with anthracene An-4 (devices 3.10-3.12), the devices do not emit light having a short blue color.

EXAMPLE 4

Preparation of Devices 4.1 Through 4.12

A series of OLED devices (4.1 through 4.12) were constructed in the following manner:

1. A glass substrate coated with a 26-27 nm layer of indium-tin oxide (ITO), as the anode, was sequentially ultrasonicated in a commercial detergent, rinsed in deionized water and exposed to oxygen plasma for about 1 min.
2. Over the ITO was deposited a fluorocarbon (CFx) first hole-injecting layer (HIL1) formed by a 10 second, plasma-assisted, deposition of $CHF_3$ as described in U.S. Pat. No. 6,208,075.
3. Over the HIL1 was deposited a second hole-injecting layer (HIL2) corresponding to 10 nm of HIM-1.
4. Next a layer of hole-transporting material 4,4'-Bis[N-(1-naphthyl)-N-phenylamino]biphenyl (NPB) was deposited to a thickness of 85.0 nm.
5. A 20 nm light-emitting layer (LEL) corresponding an anthracene material as identified in Table 3 and a boron complex corresponding to Inv-1 or C-9 as also identified in Table 3 was then deposited. The level of the boron complex is listed in Table 3 as a volume % of the LEL, the remaining volume of the LEL corresponds to the anthracene material.
6. An electron-transporting layer (ETL) corresponding to a mixture of anthracene P-1 and AM-2 (50/50) at a thickness of 31.5 nm was vacuum-deposited over the LEL.
7. An electron-injecting layer (EIL) corresponding to AM-1 was vacuum deposited onto the ETL at a thickness of 3.5 nm.
8. And finally, a 100 nm layer of aluminum was deposited onto the EIL, to form the cathode.

The above sequence completed the deposition of the EL device. The device was then hermetically packaged in a dry glove box for protection against ambient environment.

The devices thus formed were tested for efficiency (Eff., W/A) at an operating current of 20 $mA/cm^2$ and the results are reported in Table 3. The color of light produced by each device in $CIE_x$, $CIE_y$ coordinates is also listed in Table 3.

TABLE 3

Results for devices 4.1 through 4.12.

| Example (Type) | Anthracene | Boron Complex | Level (%) | Eff. (W/A) | $CIE_X$ | $CIE_Y$ |
|---|---|---|---|---|---|---|
| 4.1 (Inventive) | An-4 | Inv-1 | 0.5 | 0.135 | 0.146 | 0.086 |
| 4.2 (Inventive) | An-4 | Inv-1 | 2.0 | 0.126 | 0.144 | 0.087 |
| 4.3 (Inventive) | An-4 | Inv-1 | 1.0 | 0.131 | 0.146 | 0.085 |
| 4.4 (Inventive) | An-2 | Inv-1 | 0.5 | 0.135 | 0.146 | 0.088 |
| 4.5 (Inventive) | An-2 | Inv-1 | 2.0 | 0.138 | 0.144 | 0.087 |
| 4.6 (Inventive) | An-2 | Inv-1 | 1.0 | 0.133 | 0.145 | 0.087 |
| 4.7 (Comparative) | P-1 | Inv-1 | 0.5 | 0.114 | 0.147 | 0.126 |
| 4.8 (Comparative) | P-1 | Inv-1 | 2.0 | 0.119 | 0.143 | 0.120 |
| 4.9 (Comparative) | P-1 | Inv-1 | 1.0 | 0.113 | 0.145 | 0.125 |
| 4.10 (Comparative) | An-4 | C-9 | 0.5 | 0.165 | 0.140 | 0.113 |
| 4.11 (Comparative) | An-4 | C-9 | 2.0 | 0.125 | 0.141 | 0.122 |
| 4.12 (Comparative) | An-4 | C-9 | 1.0 | 0.154 | 0.141 | 0.117 |

It is clear from Table 3 that the inventive combination of the boron complex Inv-1 and the anthracene An-2 or An-4 affords devices (4.1-4.6) having a desirable short-blue emission color ($CIE_y$: 0.085-0.088) with good luminance efficiency. In comparative devices 4.7-4.9, the anthracene An-2 or An-4 is replaced with anthracene P-1, which has an aromatic group in the 2-position. This change shifts the emission color to less desirable coordinates ($CIE_y$: 0.120-0.126) and the luminance efficiency is also decreased. Replacing the boron complex Inv-1 with C-9 and using the anthracene An-4 (devices 4.10-4.12) also does not provide a short-blue color.

EXAMPLE 5

Preparation of Devices 5.1 Through 5.12

A series of OLED devices (5.1 through 5.6) were constructed in the following manner:

1. A glass substrate coated with a 26-27 nm layer of indium-tin oxide (ITO), as the anode, was sequentially ultrasonicated in a commercial detergent, rinsed in deionized water and exposed to oxygen plasma for about 1 min.
2. Over the ITO was deposited a fluorocarbon (CFx) hole-injecting layer (HIL) formed by a 30 second, plasma-assisted, deposition of $CHF_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 95.0 nm.
4. A 20 nm light-emitting layer (LEL) corresponding a host material as identified in Table 4 and a boron complex corresponding to Inv-3 at a level also identified in Table 4 was then deposited. The level of the boron complex is listed in Table 4 as a volume % of the LEL, the remaining volume of the LEL corresponds to the host material.
5. An electron-transporting layer (ETL) corresponding to a 35.0 nm layer of AlQ (tris(8-quinolinolato)aluminum (III)) was vacuum-deposited over the LEL.
6. An electron-injecting layer (EIL) corresponding to LiF was vacuum deposited onto the ETL at a thickness of 0.5 nm.
7. And finally, a 100 nm layer of aluminum was deposited onto the EIL, to form the cathode.

The above sequence completes the deposition of the EL device. The device was then hermetically packaged in a dry glove box for protection against ambient environment.

C-10 (CBP)

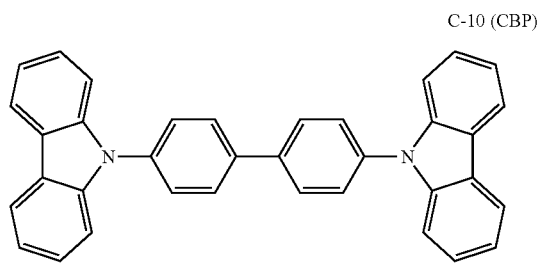

A second series of devices, 5.7-5.12, were constructed in the same manner as devices 5.1-5.6, except Inv-1 was replaced with C-1.

The devices thus formed were tested for efficiency (Eff., W/A) at an operating current of 20 mA/cm2 and the results are reported in Table 4. The color of light produced by each device in $CIE_x$, $CIE_y$ coordinates is also listed in Table 4.

TABLE 4

Results for devices 5.1 through 5.12.

| Example (Type) | LEL Host | Boron Complex | Complex (%) | Eff. (W/A) | $CIE_X$ | $CIE_Y$ |
|---|---|---|---|---|---|---|
| 5.1 (Inventive) | An-2 | Inv-3 | 0.5 | 0.051 | 0.164 | 0.146 |
| 5.2 (Inventive) | An-2 | Inv-3 | 1.0 | 0.050 | 0.162 | 0.139 |
| 5.3 (Comparative) | P-1 | Inv-3 | 0.5 | 0.039 | 0.183 | 0.246 |
| 5.4 (Comparative) | P-1 | Inv-3 | 1.0 | 0.039 | 0.183 | 0.244 |
| 5.5 (Comparative) | C-10 | Inv-3 | 0.5 | 0.027 | 0.300 | 0.534 |
| 5.6 (Comparative) | C-10 | Inv-3 | 1.0 | 0.027 | 0.295 | 0.518 |
| 5.7 (Comparative) | An-2 | C-1 | 0.5 | 0.034 | 0.176 | 0.191 |
| 5.8 (Comparative) | An-2 | C-1 | 1.0 | 0.037 | 0.175 | 0.189 |
| 5.9 (Comparative) | P-1 | C-1 | 0.5 | 0.034 | 0.189 | 0.266 |
| 5.10 (Comparative) | P-1 | C-1 | 1.0 | 0.034 | 0.193 | 0.273 |
| 5.11 (Comparative) | C-10 | C-1 | 0.5 | 0.027 | 0.300 | 0.536 |
| 5.12 (Comparative) | C-10 | C-1 | 1.0 | 0.027 | 0.296 | 0.524 |

Devices 5.1 through 5.12 have the same overall thickness and include a 95 nm layer of NPB. One can see from Table 4 that inventive devices 5.1 and 5.2, having an LEL containing a mixture of Inv-3 and the anthracene An-2, provide high luminance efficiency and a good blue color ($CIE_y$: 0.14-0.15). Corresponding comparative devices 5.3 and 5.4, wherein anthracene An-2 has been replaced with anthracene P-1, have lower efficiency and the color has shifted to an unfavorable position ($CIE_y$: 0.24-0.25). Likewise, comparative devices 5.5 and 5.6, wherein anthracene An-2 has been replaced with C-10 (4,4'-N,N'-dicarbazole-biphenyl (CBP)), show even lower efficiency and the color has shifted to a very unfavorable position ($CIE_y$: 0.52-0.53) relative to inventive devices 5.1 and 5.2.

Comparative devices 5.7 and 5.8 were constructed in the same manner as inventive devices 5.1 and 5.2, except Inv-3 was replaced with C-1. It can be seen from Table 4 that the inventive devices (5.1 and 5.2) afford higher efficiency (W/A: 0.050-0.051) relative to the comparative devices 5.7 and 5.8 (W/A: 0.034-0.037). The inventive devices also offer an improvement in the color of blue light emitted; the $CIE_y$ for device 5.2 is 0.14 versus a value of 0.19 for device 5.8.

Table 4 also indicates that combining C-1 with alternative hosts P-1 or C-10 does not significantly improve its luminance efficiency and shifts its color characteristics to an even more unfavorable position (devices 5.9-5.12). In particular, the combination of C-I and C-10 has been previously described in U.S. Pat. No. 7,074,503.

EXAMPLE 6

Preparation of Devices 6.1 Through 6.12

A series of OLED devices (6.1 through 6.12) were constructed in exactly the same manner as devices 5.1 through 5.12 (Example 5), except the layer of hole-transporting material 4,4'-Bis[N-(1-naphthyl)-N-phenylamino]biphenyl (NPB) was deposited to a thickness of 75.0 nm rather than 95.0 nm. Thus, devices 6.1-6.12 are thinner than corresponding devices 5.1-5.12.

The devices 6.1-6.12 were tested for efficiency (Eff., W/A) and emission color at an operating current of 20 mA/cm² and the results are reported in Table 5.

TABLE 5

Results for devices 6.1 through 6.12.

| Example (Type) | LEL Host | Boron Complex | Complex (%) | Eff. (W/A) | CIE$_X$ | CIE$_Y$ |
|---|---|---|---|---|---|---|
| 6.1 (Inventive) | An-2 | Inv-3 | 0.5 | 0.054 | 0.162 | 0.120 |
| 6.2 (Inventive) | An-2 | Inv-3 | 1.0 | 0.059 | 0.160 | 0.114 |
| 6.3 (Comparative) | P-1 | Inv-3 | 0.5 | 0.040 | 0.177 | 0.207 |
| 6.4 (Comparative) | P-1 | Inv-3 | 1.0 | 0.041 | 0.176 | 0.203 |
| 6.5 (Comparative) | C-10 | Inv-3 | 0.5 | 0.024 | 0.300 | 0.517 |
| 6.6 (Comparative) | C-10 | Inv-3 | 1.0 | 0.025 | 0.294 | 0.500 |
| 6.7 (Comparative) | An-2 | C-1 | 0.5 | 0.022 | 0.173 | 0.159 |
| 6.8 (Comparative) | An-2 | C-1 | 1.0 | 0.041 | 0.172 | 0.158 |
| 6.9 (Comparative) | P-1 | C-1 | 0.5 | 0.036 | 0.182 | 0.224 |
| 6.10 (Comparative) | P-1 | C-1 | 1.0 | 0.034 | 0.186 | 0.232 |
| 6.11 (Comparative) | C-10 | C-1 | 0.5 | 0.024 | 0.300 | 0.518 |
| 6.12 (Comparative) | C-10 | C-1 | 1.0 | 0.024 | 0.294 | 0.502 |

Devices 6.1-6.12 have the same overall thickness but are thinner relative to devices 5.1-5.12 (Example 5) due to a thinner layer of NPB (75 nm). The overall thickness of the device does affect the color of the light emitted as can be seen by comparing Table 4 and Table 5. However, by comparing the performance of inventive devices 6.1 and 6.2 with those of comparative 6.3-6.12, one can see that the inventive devices still provide higher efficiency and better color properties relative to the comparatives, even in a thinner device format.

Devices produced in Examples 3 and 4 include an electron-transporting layer (ETL) containing an anthracene derivative, P-1, and an alkali metal compound, AM-2, whereas devices from Examples 5 and 6 use a traditional ETL composed of Alq. Although boron complexes Inv-1, Inv-3, and Inv-4 have similar emission spectra in solution (Emax, Table 1), when incorporated into an EL device, a more preferred short-blue color is produced when the ETL contains the anthracene derivative (Examples 3 and 4). The luminance efficiency is also much higher for the devices having an ETL containing the P-1 and AM-2 combination compared to those having an ETL containing Alq.

The invention has been described in detail with particular reference to certain preferred embodiments thereof, but it will be understood that variations and modifications can be effected within the spirit and scope of the invention.

Parts List

100 OLED
110 Substrate
120 Anode
130 Hole-Injecting layer (HIL)
132 Hole-Transporting layer (HTL)
134 Light-Emitting layer (LEL)
135 Hole-Blocking Layer (HBL)
136 Electron-Transporting layer (ETL)
138 Electron-Injecting layer (EIL)
140 Cathode
150 Voltage/Current Source
160 Electrical Connectors

The invention claimed is:

1. An electroluminescent device comprising a cathode, an anode, and having therebetween a light-emitting layer comprising:
   (a) a boron complex represented by Formula (I),

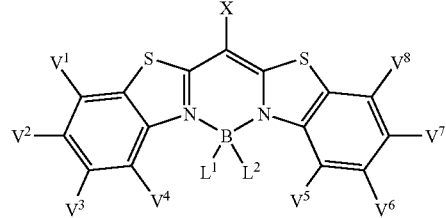

Formula (I)

wherein:
   X represents hydrogen or a substituent;
   $V^1$ through $V^8$ represent hydrogen or an independently selected substituent, provided that adjacent substituents cannot join together to form an aromatic ring group and provided at least one of $V^2$ and $V^3$ represents a substituent;
   $L^1$ and $L^2$ represent independently selected substituents;
   wherein X, $V^1$ through $V^8$, $L^1$ and $L^2$ are chosen such that the boron complex represented by Formula (I), when dissolved in ethyl acetate at a concentration of less then $10^{-3}$ molar, has a maximum fluorescence emission between a wavelength of 425 nm and 435 nm and a quantum yield of 0.70 to 1.0; and
   (b) an anthracene compound containing an anthracene nucleus substituted in the 9- and 10-positions with independently selected aryl groups containing from 6 to 24 carbon atoms, and wherein the anthracene nucleus can be further substituted provided the anthracene nucleus does not contain an aromatic substituent in positions 1-8, wherein the light-emitting layer emits blue light.

2. The device of claim 1 wherein at least one of $V^2$ and $V^3$ represents an aryl group containing from 6 to 24 carbon atoms.

3. The device of claim 1 wherein at least one of $V^2$ and $V^3$ represents an aryl group containing from 6 to 24 carbon atoms and at least one of $V^6$ and $V^7$ represents an independently selected aryl group containing from 6 to 24 carbon atoms.

4. The device of claim 1 wherein X represents hydrogen, cyano, an alkyl group containing from 1 to 24 carbon atoms, or an aryl group containing from 6 to 24 carbon atoms.

5. The device of claim 1 wherein X represents hydrogen.

6. The device of claim 1 wherein the maximum fluorescence emission is between a wavelength of 430 nm and 435 nm.

7. The device of claim 1 wherein X, $V^1$ through $V^8$, $L^1$ and $L^2$ are chosen such that the color of light emitted by the light-emitting layer has a CIE$_x$ coordinate value in the range of 0.10 to 0.20 and a CIE$_y$ value of 0.10 or less, but greater than 0.

8. The device of claim 1 wherein the boron complex is represented by Formula (II), Formula (II)

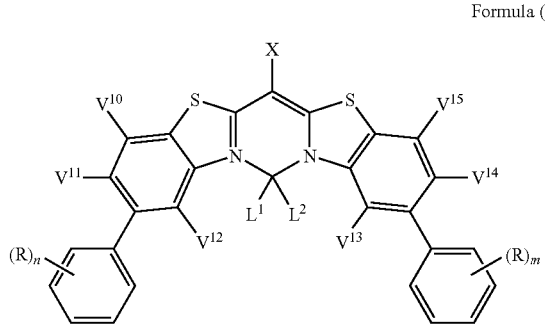

wherein:

X represents hydrogen or an alkyl group containing from 1 to 24 carbon atoms;

$V^{10}$ through $V^{15}$ represent hydrogen or an independently selected substituent, provided that adjacent substituents cannot join together to form an aromatic ring group;

each R can be the same or different and each represents an independently chosen substituent provided adjacent R groups can combine to form a ring group; n and m are independently 0-5; and $L^1$ and $L^2$ represent independently selected substituents.

9. The device of claim 8 wherein X and $V^{10}$ through $V^{15}$ represent hydrogen, and $L^1$ and $L^2$ represent fluoro.

10. The device of claim 8 wherein each R independently represents an alkyl group containing from 1 to 24 carbon atoms or aryl group containing from 6 to 24 carbon atoms, provided adjacent R groups can combine to form a ring group.

11. The device of claim 1 wherein the anthracene is represented by Formula (III)

Formula (III)

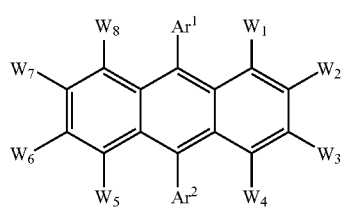

wherein:

$Ar^1$ and $Ar^2$ are independently chosen aryl groups containing from 6 to 24 carbon atoms;

$W_1$ through $W_8$ independently represent hydrogen or an alkyl group containing from 1 to 24 carbon atoms.

12. The device of claim 11 wherein $Ar^1$ and $Ar^2$ are independently chosen from the group consisting of a phenyl group, a naphthyl group, and a biphenyl group.

13. The device of claim 11 wherein $W_1$ through $W_8$ represent hydrogen.

14. The device of claim 1 including an electron-transporting layer between the light-emitting layer and the cathode and contiguous to the light-emitting layer, wherein the electron-transporting layer comprises an anthracene derivative of Formula (IV), Formula (IV)

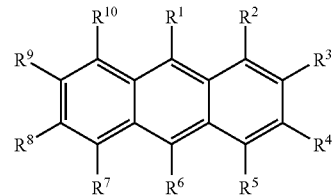

wherein:

$R^1$ and $R^6$ each independently represent an aryl group containing from 6 to 24 carbon atoms;

$R^2$-$R^5$ and $R^7$-$R^{10}$ are each independently chosen from hydrogen, alkyl groups containing from 1 to 24 carbon atoms and aromatic groups containing from 6 to 24 carbon atoms.

15. The device of claim 14 wherein the electron-transporting layer includes an alkali metal or alkali metal compound.

16. The device of claim 14 wherein the electron-transporting layer includes an organic lithium compound represented by Formula (V), $$(Li^+)_m(Q)_n \qquad \text{Formula (V)}$$

wherein:

Q is an anionic organic ligand; and m and n are independently selected integers selected to provide a neutral charge on the complex.

17. The device of claim 1 wherein the boron complex is present in an amount of 0.1 to 10.0 weight percent of the light-emitting layer.

18. An electroluminescent device comprising a cathode, an anode, and having therebetween:

(a) a light-emitting layer comprising:

(i) a boron complex represented by Formula (I),

Formula (I)

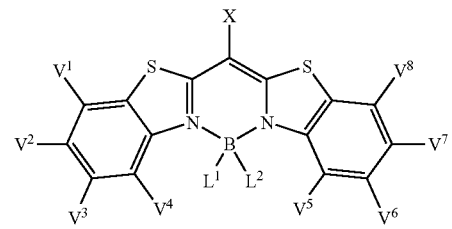

wherein:

X represents hydrogen or a substituent;

$V^1$ through $V^8$ represent hydrogen or an independently selected substituent, provided that adjacent substituents cannot join together to form an aromatic ring group and provided at least one of $V^2$ and $V^3$ represents a substituent; and $L^1$ and $L^2$ represent independently selected substituents;

wherein X, $V^1$ through $V^8$, $L^1$ and $L^2$ are chosen such that the boron complex represented by Formula (I), when dissolved in ethyl acetate at a concentration of less then $10^{-3}$ molar, has a maximum fluorescence emission between a wavelength of 425 nm and 435 nm and a quantum yield of 0.70 to 1.0; and (ii) an anthracene compound containing an anthracene nucleus substituted in the 9- and 10-positions with independently selected aryl groups containing from 6 to 24 carbon atoms, and wherein the anthracene nucleus can be further substituted provided the anthracene nucleus does not contain an aromatic substituent in positions 1-8;

wherein the light-emitting layer emits blue light; and (b) an electron-transporting layer between the light-emitting layer and the cathode and contiguous to the light-emitting layer, wherein the electron-transporting layer comprises:

(i) an anthracene derivative of Formula (IV),

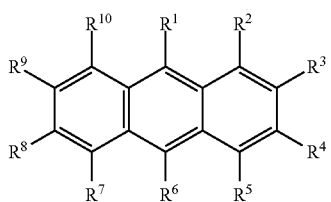

Formula (IV)

wherein:

$R^1$ and $R^6$ each independently represent an aryl group containing from 6 to 24 carbon atoms;

$R^2$-$R^5$ and $R^7$-$R^{10}$ are each independently chosen from hydrogen, alkyl groups containing from 1 to 24 carbon atoms and aromatic groups containing from 6 to 24 carbon atoms; and (ii) an alkali metal or an alkali metal compound.

19. The device of claim 18 wherein the alkali metal compound comprises an organic lithium compound represented by Formula (V), $(Li^+)_m(Q)_n$     Formula (V)

wherein:

Q is an anionic organic ligand; and m and n are independently selected integers selected to provide a neutral charge on the complex.

* * * * *